United States Patent
Kim et al.

(10) Patent No.: US 10,210,798 B2
(45) Date of Patent: Feb. 19, 2019

(54) DISPLAY DEVICE HAVING PROTECTIVE STRUCTURE

(71) Applicant: SAMSUNG DISPLAY CO., LTD., Yongin-si, Gyeonggi-Do (KR)

(72) Inventors: Deuk Jong Kim, Yongin-si (KR); Yang Hee Kim, Yongin-si (KR); Jeong Ho Lee, Yongin-si (KR); Yang Wan Lee, Yongin-si (KR); Byung Sun Kim, Yongin-si (KR); Sun Ja Kwon, Yongin-si (KR); Hyun Ae Park, Yongin-si (KR); Hyung Jun Park, Yongin-si (KR); Su Jin Lee, Yongin-si (KR); Jae Yong Lee, Yongin-si (KR); Yu Jin Jeon, Yongin-si (KR)

(73) Assignee: SAMSUNG DISPLAY CO., LTD., Yongin-si, Gyeonggi-Do (KR)

(*) Notice: Subject to any disclaimer, the term of this patent is extended or adjusted under 35 U.S.C. 154(b) by 0 days.

(21) Appl. No.: 15/590,838

(22) Filed: May 9, 2017

(65) Prior Publication Data

US 2018/0005568 A1    Jan. 4, 2018

(30) Foreign Application Priority Data

Jul. 4, 2016 (KR) .................. 10-2016-0084417
Oct. 14, 2016 (KR) .................. 10-2016-0133504

(51) Int. Cl.
*G09G 3/3208*    (2016.01)
*H01L 27/32*    (2006.01)
(Continued)

(52) U.S. Cl.
CPC ....... *G09G 3/3208* (2013.01); *H01L 27/3204* (2013.01); *H01L 27/3206* (2013.01);
(Continued)

(58) Field of Classification Search
CPC ............ H01L 27/3223; H01L 27/3204; H01L 27/3206; H01L 27/3225; H01L 27/3244; H01L 27/3246
See application file for complete search history.

(56) References Cited

U.S. PATENT DOCUMENTS 7,795,803 B2   9/2010  Kim et al.
8,895,982 B2   11/2014 Kim et al.
(Continued)

FOREIGN PATENT DOCUMENTS

KR   10-2014-0127630    11/2014
KR   10-2015-0081728    7/2015
WO   WO 2016088394      6/2016

OTHER PUBLICATIONS

English Translation of the Relevant Portion of WO 2016/088394.
Extended European Search Report for Application No. 17179273.2 dated Nov. 22, 2017.

*Primary Examiner* — Anne M Hines
(74) *Attorney, Agent, or Firm* — F. Chau & Associates, LLC

(57) ABSTRACT

A display device includes a substrate including a display configured to display an image and a non-display area disposed on at least one side of the display area. A plurality of pixels is disposed in the display area. An organic insulating layer is disposed on the substrate. A pixel defining layer is disposed on the organic insulating layer. A sealing layer at least partially covers the display area and the non-display area and includes an inorganic material. The organic insulating layer and the pixel defining layer have a valley disposed therein. The valley is formed by removing portions of the organic insulating layer and the pixel defining layer along a circumference of the display area.

26 Claims, 12 Drawing Sheets

(51) Int. Cl.
*H01L 51/50* (2006.01)
*H01L 51/00* (2006.01)
*H01L 51/52* (2006.01)

(52) U.S. Cl.
CPC ...... *H01L 27/3225* (2013.01); *H01L 27/3244* (2013.01); *H01L 27/3246* (2013.01); *H01L 51/0097* (2013.01); *H01L 51/50* (2013.01); *H01L 51/5253* (2013.01); *G09G 2330/04* (2013.01); *H01L 27/3276* (2013.01); *H01L 51/5256* (2013.01); *H01L 2251/5338* (2013.01)

(56) References Cited

U.S. PATENT DOCUMENTS

| | | | |
|---|---|---|---|
| 9,196,865 | B2 | 11/2015 | Kwak et al. |
| 9,293,738 | B2 | 3/2016 | Park et al. |
| 2013/0256638 | A1 | 10/2013 | Uesugi et al. |
| 2014/0291641 | A1 | 10/2014 | Negishi |
| 2015/0060823 | A1* | 3/2015 | Furuie ................ H01L 27/3223 257/40 |
| 2016/0190389 | A1 | 6/2016 | Lee et al. |
| 2017/0243525 | A1 | 8/2017 | Morikawa |

* cited by examiner

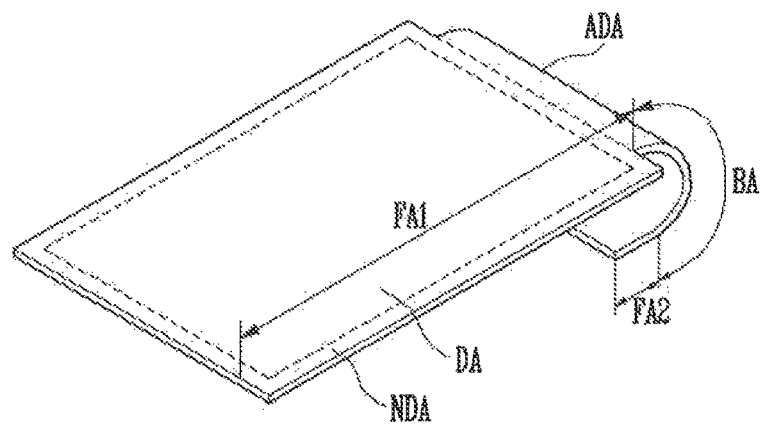
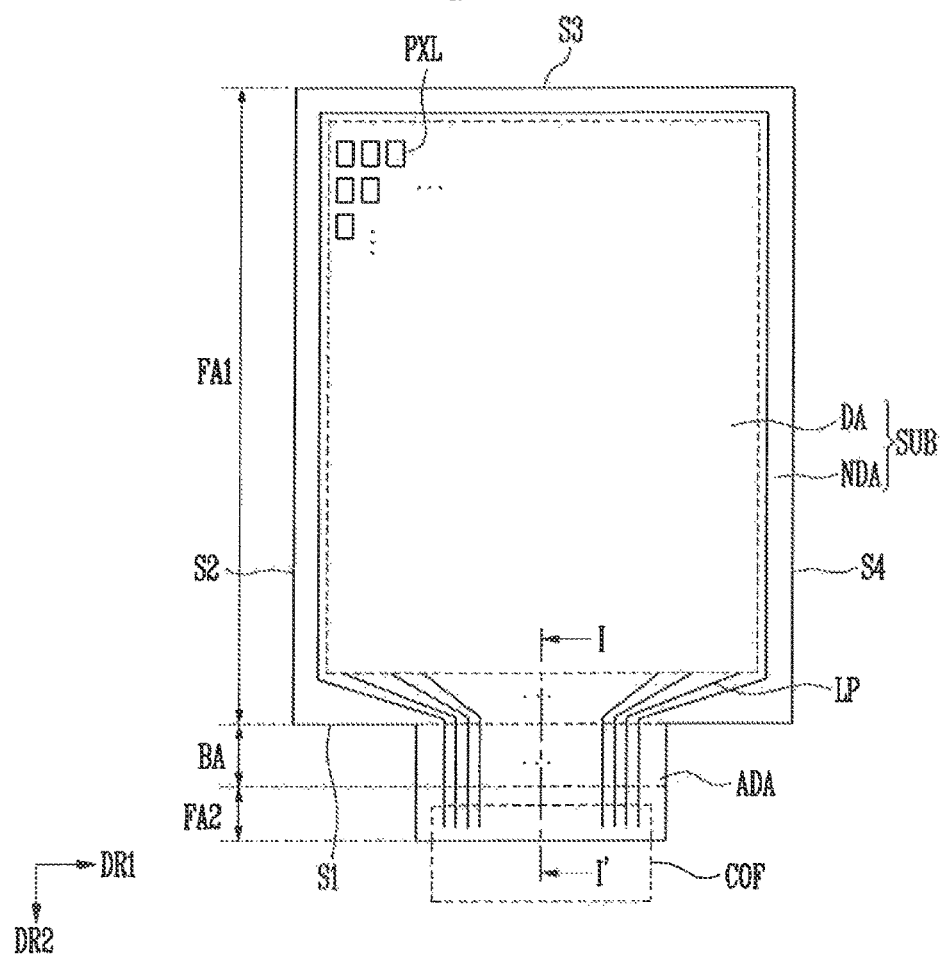

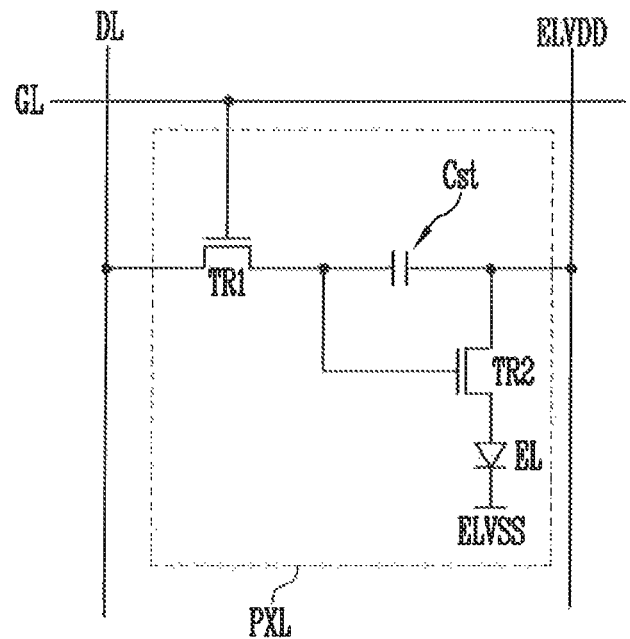

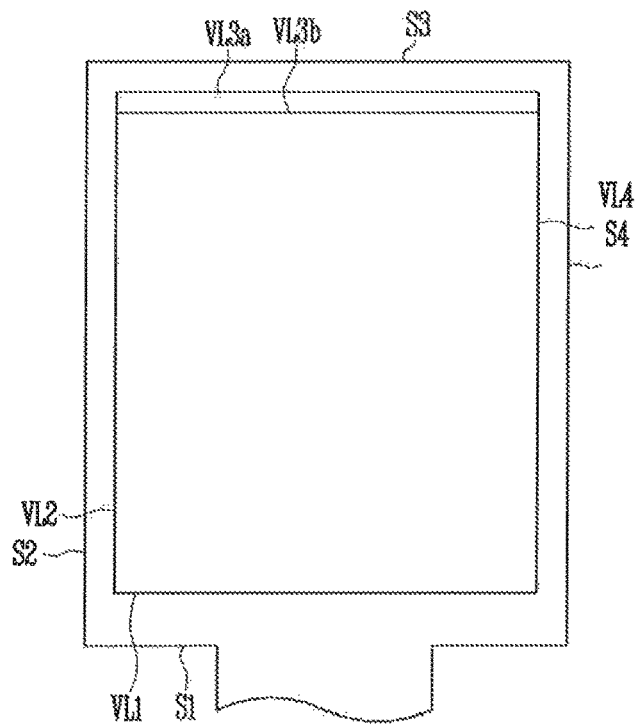
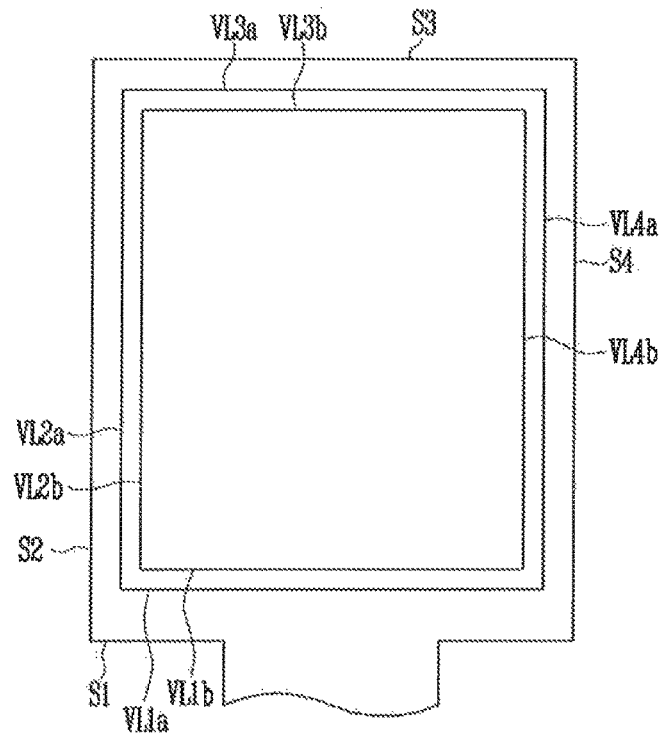

DISPLAY DEVICE HAVING PROTECTIVE STRUCTURE

CROSS-REFERENCE TO RELATED APPLICATION

This application claims priority under 35 U.S.C. § 119 to Korean Patent Application No. 10-2016-0084417, filed on Jul. 4, 2016 in the Korean Intellectual Property Office, and Korean Patent Application No. 10-2016-0133504, filed on Oct. 14, 2016 in the Korean Intellectual Property Office, the disclosures of each of which are incorporated by reference herein in their entirety.

TECHNICAL FIELD

Embodiments of the present invention relate to a display device, and more particularly, to a display device having a protective structure.

DISCUSSION OF RELATED ART

An organic light emitting display device may include a plurality of pixels each having an organic light emitting device (OLED) which is light-emitting. The organic light emitting device may include two electrodes and an organic emission layer interposed therebetween. Excitons may be formed by combining electrons injected from one of the electrodes and holes injected from the other electrode. The combination of electrons and holes occurs within the organic emission layer. The organic light emitting device may emit light when these excitons discharge energy. The organic light emitting device may be sealed by a sealing layer to protect the OLED from contamination.

SUMMARY

A display device includes a substrate including a display configured to display an image and a non-display area disposed on at least one side of the display area. A plurality of pixels is disposed in the display area. An organic insulating layer is disposed on the substrate. A pixel defining layer is disposed on the organic insulating layer. A sealing layer at least partially covers the display area and the non-display area and includes an inorganic material. The organic insulating layer and the pixel defining layer have a valley disposed therein. The valley is formed by removing portions of the organic insulating layer and the pixel defining layer along a circumference of the display area.

An organic light emitting display (OLED) device includes a substrate. A plurality of OLED pixels is disposed on a display area of the substrate. A sealing layer at least partially covers the display area of the substrate. A recessed valley is formed around a perimeter of the display area.

BRIEF DESCRIPTION OF THE DRAWINGS

A more complete appreciation of the present disclosure and many of the attendant aspects thereof will become more apparent by reference to the following detailed description when considered in connection with the accompanying drawings, of which:

FIG. 1 is a perspective view illustrating a display device according to an exemplary embodiment of the present invention;

FIG. 2 is a plan view illustrating a display device shown in FIG. 1;

FIG. 3 is an equivalent circuit diagram illustrating a case in which a pixel is a light emitting device according to an exemplary embodiment of the present invention;

FIGS. 10A to 10C are plan views illustrating a valley formed by various methods in a display device according to an exemplary embodiment of the present invention;

DETAILED DESCRIPTION OF EXEMPLARY EMBODIMENTS

Figure 4:
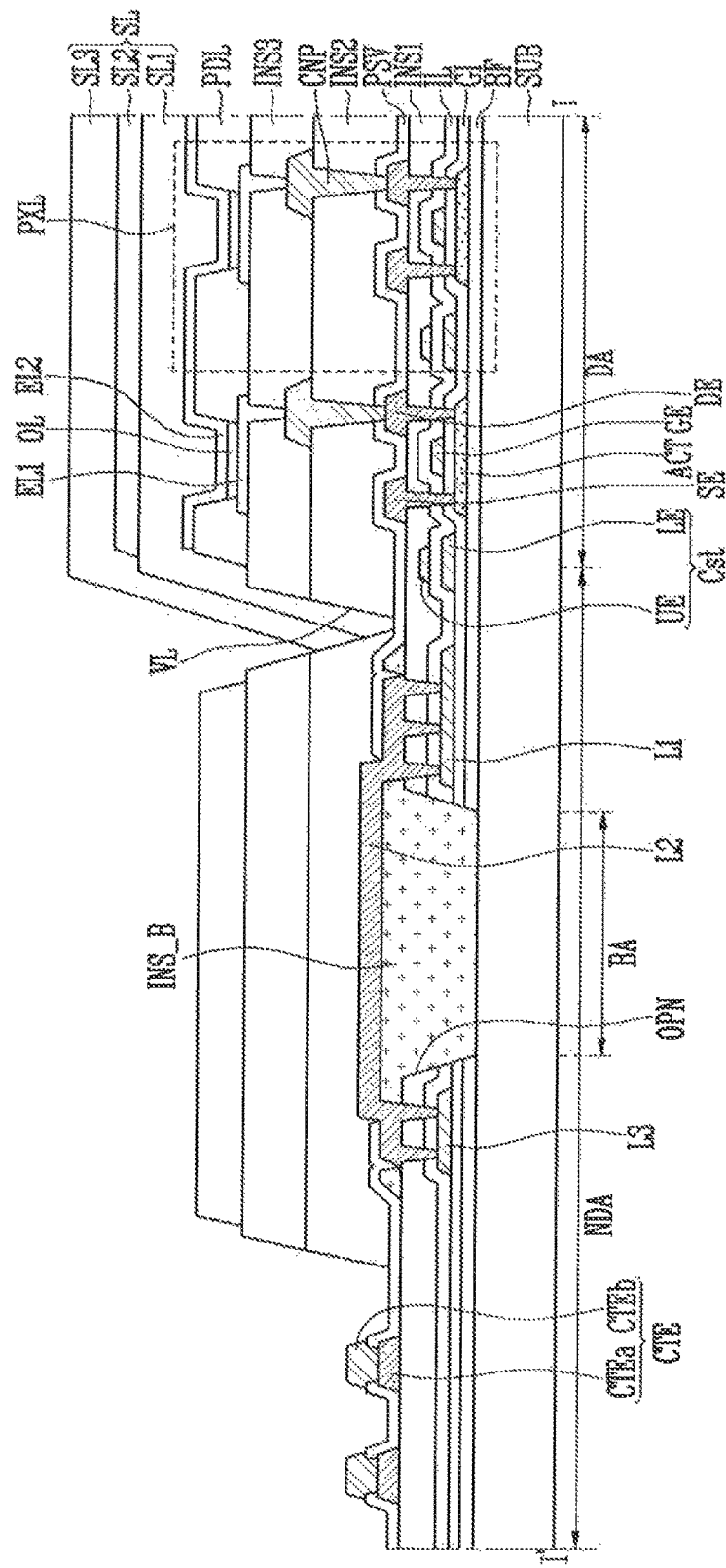
FIG. 4 is a cross-sectional diagram taken along line I-I' of FIG. 2 for illustrating some of the pixels in a display area and a non-display area.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

Like reference numerals may be used for referring to the same or similar elements throughout the description and drawings. In the attached drawings, the dimensions of the components may be exaggerated for clarity of illustration.

The present invention will now be described more fully with reference to the accompanying drawings, in which exemplary embodiments of the invention are shown.

FIG. 1 is a perspective view illustrating a display device according to an exemplary embodiment of the present invention. FIG. 2 is a plan view illustrating a display device shown in FIG. 1.

Referring to FIGS. 1 and 2, a display device according to an exemplary embodiment of the present invention may include a substrate SUB, pixels PXL disposed on the substrate SUB, and a line part LP connected to the pixels PXL.

The substrate SUB may include a display area DA and a non-display area NDA disposed on at least one side of the display area DA. For example, the non-display area NDA may be disposed on a periphery of the substrate SUB and may at least partially surround the display area DA.

The substrate SUB may have a substantially quadrangular shape, for example, a rectangular shape. According to an exemplary embodiment of the present invention, the substrate SUB may include a pair of short sides, each disposed in a first direction DR1, and a pair of long sides each disposed in a second direction DR2 which crosses the first direction. According to an exemplary embodiment of the present invention, for convenience of explanation, the four sides of the substrate SUB connected in a sequential manner from one of the short sides may be referred to as first to fourth sides S1 to S4.

However, the shape of the substrate SUB is not limited thereto and may have various shapes. For example, the substrate SUB may have various shapes, such as a closed polygon including straight sides; a circle or an oval; a semi-circle, a semi-oval, or another closed shape including straight and/or curved lines. According to an exemplary embodiment of the preset invention, when the substrate SUB has at least one straight side, at least some of the corners of the substrate SUB may be curved. For example, when the substrate SUB has a rectangular shape, a portion where adjacent straight sides meet each other may be replaced by a curved line having a predetermined curvature. For example, the vertex of the rectangular shape may include a curved side having both adjacent ends connected to two adjacent straight lines and having a predetermined curvature. This curvature may vary depending on the position thereof. For example, the curvature may vary depending on where the curved line starts and how long the curved line is.

The display area DA may refer to an area where the plurality of pixels PXL are provided to display an image thereof. The display area DA may have a shape corresponding to the shape of the substrate SUB. For example, in the same manner as the shape of the substrate SUB, the display area DA may have various shapes, such as a closed polygon including straight sides; a circle or an oval including curved sides; and a semi-circle or a semi-oval including straight and curved lines. According to an exemplary embodiment of the present invention, when the display area DA has at least one straight side, at least some of the corners of the display area DA may be curved.

The pixels PXL may be disposed on the display area DA of the substrate SUB. Each pixel PXL may be a minimum unit for displaying an image. There may be any number of pixels PXL disposed, depending on the desired resolution of the display device. The pixels PXL may emit white light and/or colored light. Each of the pixels PXL may emit light of any one of red, green, and blue. However, the invention is not limited thereto. For example, each of the pixels PXL may emit light of cyan, magenta, yellow, or the like.

Each of the pixels PXL may be a light emitting device including an organic emission layer. However, the invention is not limited thereto. The pixels may include liquid crystal devices, electrophoretic displays, or electrowetting displays without departing from the scope of the invention.

FIG. 3 is an equivalent circuit diagram illustrating an example in which the pixel PXL shown in FIG. 2 is a light emitting device.

Referring to FIG. 3, each pixel PXL as shown in FIG. 2 may include a thin film transistor connected to a line part, a light emitting device EL connected to the thin film transistor, and a capacitor Cst.

The thin film transistor may include a driving thin film transistor TR2 configured to control the light emitting device EL and a switching thin film transistor TR1 configured to switch the driving thin film transistor TR2. In an exemplary embodiment of the present invention, one pixel PXL may include two thin film transistors (TR1 and TR2). However, the invention is not limited thereto. One pixel PXL may include one thin film transistor and one capacitor, or at least three thin film transistors and at least two capacitors. For example, one pixel PXL may include a total of seven thin film transistors, light emitting devices, and storage capacitors.

The switching thin film transistor TR1 may include a gate electrode, a source electrode, and a drain electrode. The gate electrode of the switching thin film transistor TR1 may be connected to a gate line GL and the source electrode thereof may be connected to a data line DL. The drain electrode thereof may be coupled to a gate electrode of the driving thin film transistor TR2. The switching thin film transistor TR1 may transfer a data signal applied to the data line DL to the driving thin film transistor TR2 in response to a scan signal applied to the gate line GL.

The driving thin film transistor TR2 may include the gate electrode, a source electrode and a drain electrode. The gate electrode of the driving thin film transistor TR2 may be connected to the switching thin film transistor TR1, the source electrode thereof may be connected to a first power supply line ELVDD, and the drain electrode thereof may be connected to the light emitting device EL.

The light emitting device EL may include an emission layer and first and second electrodes opposing each other with the emission layer interposed therebetween. The first electrode of the light emitting device EL may be connected to the drain electrode of the driving thin film transistor TR2. The second electrode of the light emitting device EL may be connected to a second power supply line ELVSS so that a common voltage may be applied thereto. The emission layer may emit light in response to an output signal from the driving thin film transistor TR2. An image may be displayed by controlling the emission layer to emit light or to refrain from emitting light. Light emitted from the emission layer may vary depending on the material of the emission layer, and may be a colored light or a white light.

The capacitor Cst may be connected between the gate electrode and the source electrode of the driving thin film transistor TR2, and the capacitor Cst may charge and maintain a data signal input to the gate electrode of the driving thin film transistor TR2.

Referring to FIGS. 1 to 3, according to an exemplary embodiment of the present invention, the plurality of pixels PXL may be arranged in a matrix format including rows extending in the first direction DR1 and columns extending in the second direction DR2. However, the arrangement of the pixels PXL is not limited to this arrangement, and the pixels PXL may have various other arrangements. For example, the pixels PXL may be arranged in an orthogonal direction, or in an oblique direction.

The non-display area NDA may refer to an area of the display substrate SUB where the pixels PXL are not disposed. For example, an image might not be displayed on the non-display area NDA.

The line part LP is connected to the pixels PXL and a driver is connected to the line part LP. The driver is configured to drive the pixels PXL. Both the line part LP and the driver may be disposed on the non-display area NDA.

The line part LP may be connected to the pixels PXL. The line part LP may supply a signal to each of the pixels PXL and may include the gate line GL, the data line DL, the first power supply line ELVDD, and the second power supply line ELVSS. The line part LP may further include other lines where desired.

The line part LP may be disposed across the display area DA and the non-display area NDA.

The line part LP may be connected to the driver. The driver may supply a signal to each pixel PXL through the line part LP so as to control the driving of each pixel PXL.

The driver may include a scan driver providing a scan signal to each pixel PXL along the gate line GL, a data driver providing a data signal to each pixel PXL along the data line DL, and a timing controller controlling the scan driver and the data driver.

According to an exemplary embodiment of the present invention, the scan driver may be directly mounted on the substrate SUB. When the scan driver is directly mounted on the substrate SUB, the scan driver may be formed at the same time as forming the pixels PXL. However, where and how the scan driver is mounted are not limited thereto. For example, the scan driver may be formed on a separate chip and disposed on the substrate SUB by chip-on-glass technology. Alternatively, the scan driver may be mounted on a printed circuit board and connected to the substrate SUB by a connecting member.

According to an exemplary embodiment of the present invention, the data driver may be directly mounted onto the substrate SUB. However, the invention is not limited thereto. The data driver may be formed in a separate chip and this separate chip may be connected to the substrate SUB. According to an exemplary embodiment of the present invention, when the data driver is formed in a separate chip and connected to the substrate SUB, the data driver may be provided by chip-on-glass or chip-on-plastic technology. Alternatively, the data driver may be mounted on the printed circuit board and connected to the substrate SUB through a connecting member. According to an exemplary embodiment of the present invention, the data driver may be manufactured by a chip-on-film (COF) method and connected to the substrate SUB.

According to an exemplary embodiment of the present invention, the non-display area NDA may further include an additional area ADA extending therefrom. The additional area ADA may protrude from sides forming the non-display area NDA. According to an exemplary embodiment of the present invention, it is illustrated that the additional area ADA extends from one of the short sides of the substrate SUB. However, the additional area ADA may also extend from one of the long sides, or at least two of the four sides. According to an exemplary embodiment of the present invention, a data driver may be disposed on or connected to the additional area ADA. However, the invention is not limited thereto, and various components may be arranged.

According to an exemplary embodiment of the present invention, at least a portion of the display device may be flexible and the display device may be bent at the flexible portion. For example, the display device may include a bent area BA that is flexible and is bent in one direction. The display device may also include a flat area FA disposed on at least one side of the bent area BA and being flat without being bent. The flat area FA might or might not be flexible.

For example, according to an exemplary embodiment of the present invention, it is illustrated that the bent area BA is disposed in the additional area ADA. According to an exemplary embodiment of the present invention, a first flat area FA1 and a second flat area FA2 are disposed to be spaced apart from each other with the bent area BA interposed therebetween. The first flat area FA may include the display area DA. According to an exemplary embodiment of the present invention, the bent area BA may be separated from the display area DA.

In the bent area BA, when the display device is folded along a folding line, the bending line may be disposed in the bent area BA. Here, the term "folded" does not mean a fixed form but rather means that the original form can be transformed into another form. For example, the term "folded" may refer to being folded along the bending line, being curved, or being rolled up like a scroll. Therefore, according to an exemplary embodiment of the present invention, surfaces of the first and second flat areas FA1 and FA2 may be disposed on parallel to each other. However, the invention is not limited to this particular arrangement. For example, the display device may be folded so that the surfaces of the first and second flat areas FA1 and FA2 may form a predetermined angle (for example, acute, right and obtuse angles).

According to an exemplary embodiment of the present invention, the additional area ADA may be subsequently bent along the folding line, so that the width of a bezel may be reduced.

FIG. 4 is a cross-sectional view taken along line I-I' of FIG. 2 for illustrating some of the pixels in the display area pixel and the non-display area. FIG. 4 conceptually illustrates a display device according to an exemplary embodiment of the present invention.

As illustrated in FIG. 1, the display device, according to an exemplary embodiment of the present invention, may be partially bent. However, for convenience of explanation, FIG. 4 illustrates a display device which is not bent. For reference, a display device which is not bent is illustrated in cross-sectional views or plan views in relation to embodiments to be described below.

Hereinafter, referring to FIGS. 1 to 4, a display device, according to an exemplary embodiment of the present invention is described in detail.

According to an exemplary embodiment of the present invention, the plurality of pixels PXL may be disposed on the display area DA. Each pixel PXL may include a transistor connected to a corresponding line in the line part LP, a light emitting device coupled to the transistor, and the capacitor Cst. The transistor may include a driving transistor for controlling the light emitting device and a switching transistor for switching the driving transistor.

For convenience of explanation, FIG. 3 illustrates two transistors and one capacitor for one pixel PXL. However, the invention is not limited thereto. One pixel PXL may include at least two transistors and at least one capacitor, for example, each pixel may include at least three transistors and at least two capacitors.

The pixels PXL, according to an exemplary embodiment of the present invention, may be disposed on the substrate SUB.

The substrate SUB may include an insulating material such as glass or resin. In addition, the substrate SUB may include a flexible material so that the substrate SUB may be curved or folded. The substrate SUB may have a single-layer structure or a multilayer structure.

For example, the substrate SUB may include polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and/or cellulose acetate propionate. However, the substrate SUB may include various materials in addition to the above. For example, the substrate SUB may include Fiber reinforced plastic (FRP).

A buffer layer BF may be formed on the substrate SUB. The buffer layer BF may prevent diffusion of impurities into switching and driving transistors. The buffer layer BF may be disposed as a single layer, or as a multilayer structure including at least two layers.

The buffer layer BF may be an inorganic insulating layer including an inorganic material. For example, the buffer layer BF may include silicon nitride, silicon oxide, silicon oxynitride, or the like. When the buffer layer BF has a multilayer structure, the respective layers may include the same or different materials from each other. The buffer layer BF may be omitted depending on the material and process conditions of the substrate SUB.

An active pattern ACT may be disposed on the buffer layer BF and may include a semiconductor material. The active pattern ACT may include a source region, a drain region, and a channel region disposed between the source region and the drain region. The active pattern ACT may be a semiconductor pattern including polysilicon, amorphous silicon, or oxide semiconductor. The channel region may be a semiconductor pattern which is not doped with impurities, for example, an intrinsic semiconductor. The source region and the drain region may be semiconductor patterns doped with impurities. The impurities may include n-type impurity impurities, p-type impurities, and/or other metals.

A gate insulating layer GI may be disposed on the active pattern ACT. The gate insulating layer GI may be an inorganic insulating layer including an inorganic material or an organic insulating layer including an organic material. For the inorganic material of the gate insulating layer GI, an inorganic insulating material, such as polysiloxane, silicon nitride, silicon oxide, silicon oxynitride, or the like, may be used. The organic material may be an organic insulating material such as polyacrylic compounds, polyimide compounds, fluorocarbon compounds such as Teflon, and benzocyclobutene compounds.

A gate electrode GE and a capacitor lower electrode LE may be disposed on the gate insulating layer GI. The gate electrode GE may cover a region at a position corresponding to the channel region of the active pattern ACT.

The gate electrode GE and the capacitor lower electrode LE may include metal. For example, the gate electrode GE may include gold (Au), silver (Ag), aluminum (Al), molybdenum (Mo), chromium (Cr), titanium (Ti), nickel (Ni), neodymium (Nd), and/or copper (Cu), and/or alloys thereof. In addition, the gate electrode GE may include a single layer. However, the invention is not limited thereto. For example, the gate electrode GE may have a multilayer structure including at least two of the metals and the alloys.

According to an exemplary embodiment of the present invention, though not illustrated, other lines including gate lines, may be formed of the same material and on the same layer as the gate electrode GE and the capacitor lower electrode LE. The lines including the gate lines may be directly or indirectly coupled to some transistors in each pixel PXL, for example, the gate electrode GE.

An interlayer insulating layer IL may be disposed on the gate electrode GE and the capacitor lower electrode LE. The interlayer insulating layer IL may be an inorganic insulating layer including an inorganic material. Examples of the inorganic material may include polysiloxane, silicon nitride, silicon oxide, and silicon oxynitride.

A capacitor upper electrode UE may be disposed on the interlayer insulating layer IL. The capacitor upper electrode UE may include metal. For example, the capacitor upper electrode UE may include gold (Au), silver (Ag), aluminum (Al), molybdenum (Mo), chromium (Cr), titanium (Ti), nickel (Ni), neodymium (Nd), and/or copper (Cu), and/or alloys thereof. In addition, the capacitor upper electrode UE may include a single layer, but the invention is not limited thereto. For example, the capacitor upper electrode UE may have a multilayer structure including at least two of the metals and the alloys.

The capacitor lower electrode LE and the capacitor upper electrode UE may form the capacitor Cst with the interlayer insulating layer IL interposed therebetween. According to an exemplary embodiment of the present invention, the capacitor Cst may include the capacitor lower electrode LE and the capacitor upper electrode UE. However, the invention is not limited thereto, and the capacitor Cst may be formed in various configurations.

A first insulating layer INS1 may be disposed on the capacitor upper electrode UE. The first insulating layer INS1 may be an inorganic insulating layer including an inorganic material. Examples of the inorganic material may include polysiloxane, silicon nitride, silicon oxide, and silicon oxynitride.

A source electrode SE and a drain electrode DE may be disposed on the first insulating layer INS1. The source electrode SE and the drain electrode DE may contact the source region and the drain region of the active pattern ACT, respectively, through contact holes formed in the first insulating layer INS1, the interlayer insulating layer IL and the gate insulating layer GI.

The source electrode SE and the drain electrode DE may include metal. For example, the source electrode SE and the drain electrode DE may include gold (Au), silver (Ag), aluminum (Al), molybdenum (Mo), chromium (Cr), titanium (Ti), nickel (Ni), neodymium (Nd), and/or copper (Cu), and/or alloys thereof. In addition, each of the source electrode SE and the drain electrode DE may include a single layer. However, the invention is not limited thereto. For example, each of the source electrode SE and the drain electrode DE may have a multilayer structure including at least two of the metals and the alloys.

According to an exemplary embodiment of the present invention, the data lines or the first power supply lines may be formed of the same material and on the same layer as the source electrode SE and the drain electrode DE. The data lines or the first power supply lines may be directly or indirectly connected to some of the transistors in each pixel PXL, for example, the source electrode SE and/or drain electrode DE.

A passivation layer PSV may be disposed on the source electrode SE and the drain electrode DE. The passivation layer PSV may be an inorganic insulating layer including an inorganic material. Examples of the inorganic materials may include polysiloxane, silicon nitride, silicon oxide, and silicon oxynitride. The passivation layer PSV may be omitted according to some exemplary embodiments of the present invention.

A second insulating layer INS2 may be disposed on the passivation layer PSV. When the passivation layer PSV is not formed, the second insulating layer INS2 may be disposed on the first insulating layer INS1.

The second insulating layer INS2 may be an organic insulating layer including an organic material. The organic material may be an organic insulating material such as polyacrylic compounds, polyimide compounds, fluorocarbon compounds, such as Teflon, and benzocyclobutene compounds.

A coupling pattern CNP may be disposed on the second insulating layer INS2. The coupling pattern CNP may be coupled to the drain electrode DE of the transistor through the contact hole passing through the second insulating layer INS2 and the passivation layer PSV. The coupling pattern CNP may include metals such as gold (Au), silver (Ag), aluminum (Al), molybdenum (Mo), chromium (Cr), titanium (Ti), nickel (Ni), neodymium (Nd), and/or copper (Cu), and/or alloys thereof. In addition, the coupling pattern CNP may be formed in a single layer. However, the invention is not limited thereto. For example, the coupling pattern CNP may have a multilayer structure including at least two of the metals and the alloys.

According to an exemplary embodiment of the present invention, other lines including a dummy power supply line may be formed of the same material and on the same layer as the coupling pattern CNP.

A third insulating layer INS3 may be disposed on the coupling pattern CNP. The third insulating layer INS3 may be an organic insulating layer including an organic material. The organic material may be an organic insulating material such as polyacrylic compounds, polyimide compounds, fluorocarbon compounds such as Teflon, and benzocyclobutene compounds.

A first electrode EL1 may be disposed on the third insulating layer INS3. The first electrode EL1 may be coupled to the coupling pattern CNP through a contact hole passing through the third insulating layer INS3 and coupled to the drain electrode DE through a contact hole passing through the second insulating layer INS2 and the passivation layer PSV, so that the first electrode EL1 may be coupled to the transistor. The first electrode EL1 may function as either an anode or a cathode.

According to an exemplary embodiment of the present invention, the organic insulating layer including the second insulating layer INS2 and the third insulating layer INS3 is disposed on the passivation layer PSV. However, the invention is not limited thereto and the organic insulating layer may be arranged at a different position. For example, one organic insulating layer may be disposed between the first electrode EL1 and the passivation layer PSV. According to an exemplary embodiment of the present invention, only a single organic insulating layer might be disposed on the passivation layer PSV and the first electrode EL1 may be disposed on the organic insulating layer. In this example, the coupling pattern CNP might not be formed, and the first electrode EL1 may be directly connected to the drain electrode DE through the contact hole formed in the organic insulating layer. Hereinafter, an exemplary embodiment of the present invention in which the organic insulating layer consists of the second insulating layer INS2 and the third insulating layer INS3 is described. However, the organic insulating layer may be a single layer that is included in addition to the organic insulating layer that is formed of the second insulating layer INS2 and the third insulating layer INS3.

The first electrode EL1 may include a metal layer such as Ag, Mg, Al, Pt, Pd, Au, Ni, Nd, Ir, and/or Cr, and/or an alloy thereof, and/or an transparent conductive layer of ITO (indium tin oxide), IZO (indium zinc oxide), ZnO (zinc oxide), and/or ITZO (indium tin zinc oxide).

According to an exemplary embodiment of the present invention, the first electrode EL1 may include only a single type of metal. However, the invention is not limited thereto. For example, the first electrode EL1 may include two or more types of metal, for example, an alloy of Ag and Mg.

The first electrode EL1 may include a transparent conductive layer when an image is disposed in a lower direction of the substrate SUB. The first electrode EL1 may include a metal reflective layer and/or a transparent conductive layer when an image is disposed in an upper direction of the substrate SUB.

A pixel defining layer PDL dividing a pixel PXL region so as to correspond to each pixel PXL may be disposed on the substrate SUB on which the first electrode EL1 is formed. The pixel defining layer PDL may be an organic insulating layer including an organic material. The organic material may be an organic insulating material such as polyacrylic compounds, polyimide compounds, fluorocarbon compounds such as Teflon, and benzocyclobutene compounds.

The pixel defining layer PDL may expose a top surface of the first electrode EL1 and may protrude from the substrate SUB along the circumference of the pixel PXL.

An organic emission layer OL may be disposed in the pixel PXL region surrounded by the pixel defining layer PDL.

The organic emission layer OL may include a low-molecular or high-molecular material. The low-molecular material may include copper phthalocyanine (CuPc:), N,N'-Di(naphthalene-1-yl)-N,N'-diphenyl-benzidine: NPB, tris-8-hydroxyquinoline aluminum Alq3, or the like. These materials may be formed by vacuum deposition. The high-molecular material may include PEDOT, poly-phenylene vinylene (PPV) and polyfluorene.

The organic emission layer OL may be formed as a single layer. However, the organic emission layer OL may alternatively include a multilayer structure including various functional layers. The organic emission layer OL has a multilayer structure, the organic emission layer OL may have a single or composite multilayer structure of a hole injection layer, a hole transport layer, an emission layer, an electron transport layer, and an electron injection layer. The organic emission layer OL may be formed by evaporation, screen printing, inkjet printing, laser induced thermal imaging (LITI), or the like.

However, the organic emission layer OL is not necessarily limited thereto. The organic emission layer OL may have various structures. At least a portion of the organic emission layer OL may be formed integrally with the plurality of first electrodes EL1, or the organic emission layers OL may be individually disposed so as to correspond to the plurality of first electrodes EL1, respectively.

A second electrode EL2 may be disposed on the organic emission layer OL. The second electrode EL2 may be disposed at each pixel PXL and may cover almost the entire area of the display area DA. However, the second electrode EL2 may be shared by each of the pixels PXL.

The second electrode EL2 may function as either an anode or a cathode, according to an exemplary embodiment of the present invention. When the first electrode EL1 is an anode, the second electrode EL2 may serve as a cathode. When the first electrode EL1 is a cathode, the second electrode EL2 may serve as an anode.

The second electrode EL2 may include a metal layer of Ag, Mg, Al, Pt, Pd, Au, Ni, Nd, Ir, and/or Cr, and/or a transparent conductive layer of indium tin oxide (ITO), indium zinc oxide (IZO), zinc oxide (ZnO), and/or indium tin zinc oxide (ITZO). According to an exemplary embodiment of the present invention, the second electrode EL2 may have a multilayer structure including at least two layers, for example, a triple layer of ITO/Ag/ITO.

The second electrode EL2 may include a metal reflective layer and/or a transparent conductive layer when an image is provided in a lower direction of the substrate SUB. The second electrode EL2 may include a transparent conductive layer when an image is provided in an upper direction of the substrate SUB.

The sealing layer SL may be disposed on the second electrode EL2. The sealing layer SL may be formed in a single layer, or as a multilayer. According to an exemplary embodiment of the present invention, the sealing layer SL may include first to third sealing layers SL1 to SL3. Each of the first to third sealing layers SL1 to SL3 may include an organic material and/or an inorganic material. The third sealing layer SL3 may be disposed at the outermost edge and may include an inorganic material.

According to an exemplary embodiment of the present invention, the first sealing layer SL1 may include an inorganic material, the second sealing layer SL2 may include an organic material or an inorganic material, and the third sealing layer SL3 may include an inorganic material. In comparison with the organic material, the inorganic material may be less affected by intrusion of moisture or oxygen. However, the organic material may be vulnerable to cracks since it may be less elastic or flexible. Since the first sealing layer SL1 and the third sealing layer SL3 include an inorganic material and the second sealing layer SL2 includes an organic material, crack propagation may be prevented. When the second sealing layer SL2 includes the organic material, the second sealing layer SL2 may be completely covered by the third sealing layer SL3 so that an end portion thereof might not be exposed to the outside.

According to an exemplary embodiment of the present invention, the organic material may be an organic insulating material such as polyacrylic compounds, polyimide compounds, fluorocarbon compounds such as Teflon, and benzocyclobutene compounds. Examples of the inorganic material may include polysiloxane, silicon nitride, silicon oxide, and silicon oxynitride. When the second sealing layer SL2 includes an inorganic material instead of an organic material, various types of silicon insulating materials, for example, hexamethyldisiloxane (HMDSO), octamethylcyclotetrasiloxane (OMCTSO), and tetramethyldisiloxane (TMDSO), tetraethyleorthosilicate (TEOS) may be used. According to an exemplary embodiment of the present invention, the organic emission layer OL forming the light emitting device may be easily damaged by external moisture or oxygen. The sealing layer SL may protect them by covering the organic emission layer OL. The sealing layer SL may cover the display area DA and extend beyond the display area DA.

However, although insulating layers including an organic material may be flexible and elastic, these insulating layers may be more readily damaged by moisture or oxygen in comparison with insulating layers including an inorganic material. According to an exemplary embodiment of the present invention, in order to prevent intrusion of oxygen or moisture by insulating layers including an organic material, end portions of the insulating layers including the inorganic material may be covered by the insulating layers including the organic material. For example, the second insulating layer INS2, the third insulating layer INS3, and/or the pixel defining layer PDL including the organic material may extend to a portion of the non-display area NDA and might not cover the entire non-display area NDA. The second insulating layer INS2, the third insulating layer INS3, and/or the pixel defining layer PDL including the organic material may include a valley VL which is partially removed along the circumference of the display area DA. The second insulating layer INS2, the third insulating layer INS3 and/or the pixel defining layer PDL and the valley VL are described below.

In an exemplary embodiment of the present invention, a top surface of the pixel defining layer PDL, and side surfaces of the second insulating layer INS2, the third insulating layer INS3, and/or the pixel defining layer PDL exposed by the valley VL may be sealed by an insulating layer including an inorganic material, for example, the sealing layer SL, thereby preventing external exposure. However, the structure or material of the sealing layer SL is not limited thereto.

For example, the sealing layer SL may include a plurality of organic material layers and a plurality of inorganic material layers which are stacked alternately with each other.

The non-display area NDA is described below. Where components are not described in detail below, it may be assumed that the non-described components are similar to corresponding elements previously described.

According to an exemplary embodiment of the present invention, the line part LP may be disposed in the non-display area NDA and may include the bent area BA where the substrate SUB is folded.

The line part LP may connect the driver to the pixels PXL. For example, the line part LP may include gate lines, data lines, and power supply lines. According to an exemplary embodiment of the present invention, the lines may be data lines forming the line part LP. However, the lines of the line part LP may be formed in a different manner.

The line part LP, according to an exemplary embodiment of the present invention, may include a plurality of lines. Each of the lines may connect the pixels PXL to the driver and may extend from the pixels PXL in approximately the second direction DR2. The lines may extend to an end portion of the additional area ADA in the second direction DR2 and contact electrodes CTE may be disposed to the end portion. The pixels PXL may be connected to the driver realized by chip on film through the contact electrodes CTE connected to the lines.

The line part LP may include first to third lines L1 to L3. Each of the first lines L1 may be connected to each of the second lines L2, and each of the second lines L2 may be connected to each of the third lines L3. For convenience of explanation, FIG. 4 illustrates some of the first to third lines L1 to L3.

The buffer layer BF may be disposed in the non-display area NDA of the substrate SUB. The buffer layer BF may have an opening OPN in the bent area BA.

The gate insulating layer GI may be disposed on the buffer layer BF.

The first lines L1 and the third lines L3 may be disposed on the gate insulating layer GI. The first lines L1 may be disposed in the first flat area FA1 and the third lines L3 may be disposed in the second flat area FA2. The first lines L1 and the third lines L3 may be formed using the same material as the gate electrode GE by the same process as the gate electrode GE.

The interlayer insulating layer IL may be disposed over the first lines L1 and the third lines L3.

The first insulating layer INS1 may be disposed on the interlayer insulating layer IL.

The opening OPN may be formed in the insulating layers disposed in the bent area BA. The bent area BA may refer to an area where the substrate SUB is bent. Portions corresponding to the bent area BA may be removed from the buffer layer BF, the gate insulating layer GI, the interlayer insulating layer IL, and the first insulating layer INS1 to thereby form the opening OPN. However, according to an exemplary embodiment of the present invention, the portions corresponding to the bent area BA might not be removed from the buffer layer BF, the gate insulating layer GI, the interlayer insulating layer IL, and the first insulating layer INS1. For example, the portion of the buffer layer BF corresponding to the bent area BA might not be removed, whereas the portions of the gate insulating layer GI, the interlayer insulating layer IL, and the first insulating layer INS1 corresponding to the bent area BA may be removed, so that the opening OPN may be formed.

When the opening OPN corresponds to the bent area BA, the opening OPN may overlap with the bent area BA. The opening OPN may have a greater area than the bent area BA. According to an exemplary embodiment of the present invention, the opening OPN may have the same width as the bent area BA. However, alternatively, the opening OPN may have a greater width than the bent area BA.

As illustrated in FIG. 4, inner surfaces of the buffer layer BF, the gate insulating layer GI, the interlayer insulating layer IL, and the first insulating layer INS1 may coincide with each other and be arranged in a straight line. However, the invention is not limited thereto. For example, the opening OPN of the buffer layer BF may have a greater area than the opening OPN of the first insulating layer INS1. According to an exemplary embodiment of the present invention, the opening OPN of the buffer layer BF may be defined as having the smallest area, among the opening OPN of the gate insulating layer GI, the opening OPN of the interlayer insulating layer IL, and the opening OPN of the first insulating layer INS1.

A bending insulating layer INS_B may be disposed in the opening OPN. The bending insulating layer INS_B may fill at least a portion of the opening OPN. As illustrated in FIG. 4, the opening OPN may be completely filled with the bending insulating layer INS_B. According to an exemplary embodiment of the present invention, the bending insulating layer INS_B may fill the opening OPN and at the same time, cover an area adjacent to the opening OPN, for example, an upper portion of the first insulating layer INS1 corresponding to the first and/or second flat area FA1 or FA2.

The bending insulating layer INS_B may be an organic insulating layer including an organic material. The organic material may be an organic insulating material such as polyacrylic compounds, polyimide compounds, fluorocarbon compounds, such as Teflon, and benzocyclobutene compounds.

The second lines L2 may be disposed on the first insulating layer INS1 and the bending insulating layer INS_B. In addition, lower contact electrodes CTEa may be disposed on the first insulating layer INS. The second lines L2 and the lower contact electrode CTEa may be formed of the same material as the source electrode SE and the drain electrode DE by the same process thereof. The second lines L2 may extend from the first flat area FA1 FA2 via the bent area BA to the second flat area and be located on the bending insulating layer INS_B. The second lines L2 may be located on the first insulating layer INS1 at a portion where the bending insulating layer INS_B is not disposed.

As described above, FIG. 4 illustrates that the display device is not bent. However, the display device, according to an exemplary embodiment of the present invention, may be bent in the bent area BA. The display device, according to an exemplary embodiment of the present invention, may be manufactured in a flat state and then may be bent.

According to an exemplary embodiment of the present invention, it is illustrated that the bent area BA coincides with a portion where the inorganic insulating layer is removed. The bent area BA and the portion where the inorganic insulating layer is removed might not coincide with each other. For example, the bent area BA may generally correspond to the portion where the inorganic insulating layer is removed. However, the bent area BA may be wider or narrower than the portion where the inorganic insulating layer is removed, where desired. In an exemplary embodiment of the present invention, the bent area BA is located only in the non-display area NDA. However, the invention is not limited thereto. For example, the bent area BA may be disposed across the non-display area NDA and the display area DA, or in the display area DA alone.

The passivation layer PSV may be disposed on the substrate SUB where the second lines L2 are formed. The passivation layer PSV may be an inorganic insulating layer. The passivation layer PSV might not be disposed in an area corresponding to the bent area BA, such as the above-described inorganic insulating layers (the buffer layer BF, the gate insulating layer GI, the interlayer insulating layer IL, and/or the first insulating layer INS1). In addition, the passivation layer PSV may expose a portion of a top surface of the lower contact electrode CTEa.

The second insulating layer INS2 may be disposed on the passivation layer PSV. The third insulating layer INS3 may be disposed on the second insulating layer INS2. The valley VL may be formed by partially removing the second insulating layer INS2 and the third insulating layer INS3 along the circumference of the display area DA. Thus, the second insulating layer INS2 and the third insulating layer INS3 might not continuously extend from the display area DA to the non-display area NDA.

As described above, the side surfaces of the second insulating layer INS2 and the third insulating layer INS3, which are disposed in the display area DA, may be covered by the sealing layer SL. However, a top surface of the third insulating layer INS3 and the side surfaces of the third insulating layer INS3 and the second insulating layer INS2 disposed in the non-display area NDA might not be completely covered by the sealing layer SL. For example, at least portions thereof may be exposed to the outside.

After the second insulating layer INS2 is formed, upper contact electrodes CTEb may be formed. The upper contact electrode CTEb may be formed of the same material as the coupling pattern CNP in the display area DA by the same process thereof. The lower contact electrode CTEa and the upper contact electrode CTEb may constitute the contact electrode CTE, and the lines may be connected to a driver realized as a chip on film or a flexible printed circuit board through the contact electrode CTE.

The connection relationship between the first lines L1 and the second lines L2 is described below. The second lines L2 and the third lines L3 may be connected by substantially the same method as the first lines L1 and the second lines L2.

For example, when the first, second, and third lines L1, L2, and L3 are disposed to transfer data signals to pixels, the first lines L1 may further include a contact portion so as to be connected to the data lines in the display area DA at an adjacent portion to the display area DA.

Figure 5:
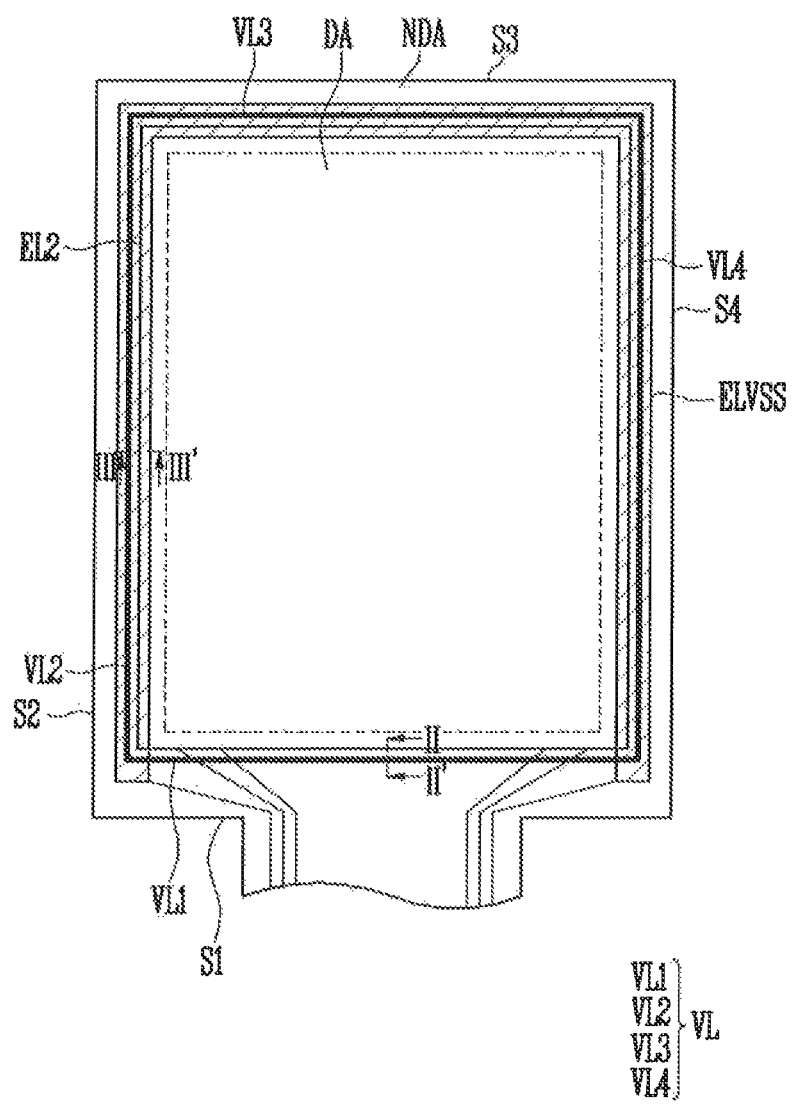
FIG. 5 is a plan view illustrating some of the components relating to a valley in a non-display area of a display device according to an exemplary embodiment of the present invention.

FIG. 5 is a plan view illustrating some of the components relating to the valley of the non-display area NDA in a display device according to an exemplary embodiment of the present invention.

Referring to FIG. 5, the substrate SUB, according to an exemplary embodiment of the present invention, may have a rectangular shape. The substrate SUB may have four sides which are connected, e.g., the first to fourth sides S1 to S4.

The substrate SUB may include the display area DA and the non-display area NDA disposed on at least one side of the display area DA. According to an exemplary embodiment of the present invention, the display area DA of the display device may have a rectangular shape, and the non-display area NDA may have a square ring or frame shape surrounding the display area DA.

A line part may be disposed in the non-display area NDA. As illustrated in FIG. 2, the data lines may be disposed in the non-display area NDA corresponding to the first side S1. The second power supply line ELVSS may be disposed along the edge of the display area DA in the non-display area NDA corresponding to the second, third, and fourth sides S2, S3, and S4. The second power supply line ELVSS may have a predetermined width in the non-display area NDA corresponding to the second, third, and fourth sides S2, S3, and S4. However, the arrangement of the second power supply line ELVSS is not limited thereto. The second power supply line ELVSS may have various arrangements. For example, the second power supply line ELVSS may have predetermined widths on the second side S2 and the fourth side S4, while the second power supply line ELVSS might not be disposed on the third side S3 or may have a smaller width than the widths on the second side S2 and the fourth side S4. Alternatively, the second power supply line ELVSS may be formed with a predetermined width on one of the second, third, and fourth sides S2, S3, and S4 and might not be disposed on the other sides, or may be formed with a smaller width than the predetermined width. Alternatively, the second power supply line ELVSS may have a predetermined width on a portion of one side and a smaller width than the predetermined width on another portion thereof. The second power supply line ELVSS may be connected to the driver through some of the lines disposed in the non-display area NDA corresponding to the first side S1.

According to an exemplary embodiment of the present invention, in addition to the above-described data lines and the second power supply line ELVSS, additional lines for driving the pixels may be further disposed to the non-display area NDA.

The second electrode EL2 may cover the display area DA and extend outwardly from the display area DA to partially cover the non-display area NDA. According to an exemplary embodiment of the present invention, the second electrode EL2 may extend from the display area DA to an area between the display area DA and the valley VL. Therefore, in the non-display area NDA, the second electrode EL2 may overlap with at least a portion of the second power supply line ELVSS. A plurality of contact holes may be disposed between the second electrode EL2 and the second power supply line ELVSS and may contact the second electrode EL2 and the second power supply line ELVSS through the contact holes. As a result, in the non-display area NDA, the second electrode EL2 may be electrically connected to the second power supply line ELVSS.

The valley VL formed by partially removing the organic insulating layer along the circumference of the display area DA may be disposed in the non-display area NDA. The valley VL may surround the display area DA. According to an exemplary embodiment of the present invention, the valley VL may have a closed shape to completely surround the display area DA. However, the valley VL might not necessarily have the closed shape. For example, one portion of the valley VL may be opened where desired.

The valley VL may include first, second, third and fourth valleys VL1, VL2, VL3, and VL4 corresponding to the first, second, third, and fourth sides S1, S2, S3, and S4 of the substrate SUB, respectively. The first valley VL1 may extend in an extending direction of the first side S1 of the substrate SUB in the non-display area NDA. The second valley VL2 may extend in an extending direction of the second side S2 of the substrate SUB in the non-display area NDA. The third valley VL3 may extend in an extending direction of the third side S3 of the substrate SUB in the non-display area NDA. The fourth valley VL4 may extend in an extending direction of the fourth side S4 of the substrate SUB in the non-display area NDA.

As illustrated in FIG. 5, the first, second, third and fourth valleys VL1, VL2, VL3, and VL4 may each be straight lines. However, each of the first to fourth valleys may alternatively be an opening having a predetermined width. As viewed in the plane, the first, second, third and fourth valleys VL1, VL2, VL3, and VL4 might not necessarily extend in a straight direction as viewed in the plane. According to an exemplary embodiment of the present invention, the shapes of the first, second, third and fourth valleys VL1, VL2, VL3, and VL4 may vary depending on the arrangement of the lines where the first, second, third and fourth valleys VL1, VL2, VL3, and VL4 are disposed. For example, at least some of the first, second, third and fourth valleys VL1, VL2, VL3, and VL4 may be bent at least once or curved as viewed in the plane.

The valley VL may partially overlap with the second power supply line ELVSS. As illustrated in FIG. 5, the first valley VL1 might not overlap with the second power supply line ELVSS and each of the second to fourth valleys VL2 to VL4 may overlap with the second power supply line ELVSS.

According to an exemplary embodiment of the present invention, the valley VL might not overlap with the second electrode EL2. However, the invention is not limited thereto. For example, according to an exemplary embodiment of the present invention, the second electrode EL2 may extend to the valley VL to cover a top surface of the valley VL together with the second power supply line ELVSS.

Hereinafter, the shapes of the first, second, third and fourth valleys VL1, VL2, VL3, and VL4 are described with reference to the drawings.

Figure 6:
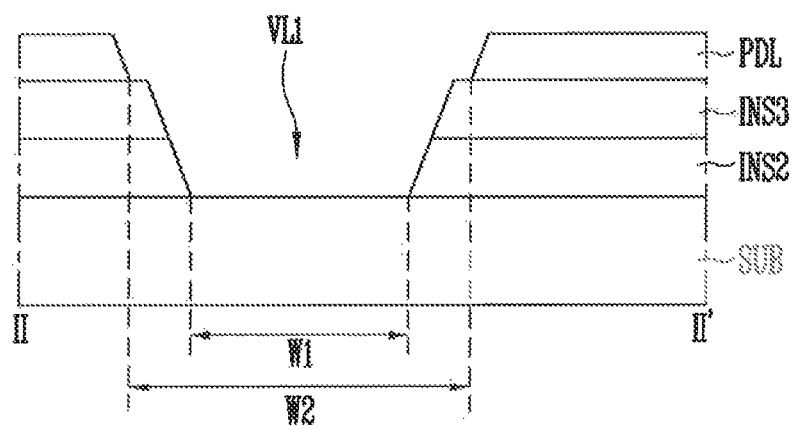
FIG. 6 is a cross-sectional diagram taken along line II-II' of FIG. 5 in a display device according to an exemplary embodiment of the present invention.

FIG. 6 is a cross-sectional view taken along line II-II' of FIG. 5 in a display device according to an exemplary embodiment of the present invention. Additional components may be disposed between the substrate SUB and the second insulating layer INS2 according to the approach illustrated in FIG. 6. The components which may be disposed between the substrate SUB and the second insulating layer INS2, but are not illustrated in FIG. 6, may include insulating layers, such as a buffer layer, a gate insulating layer, an interlayer insulating layer, a first insulating layer, a passivation layer and a sealing layer, and lines disposed on each of the insulating layers, such as other lines including gate lines and data lines. Hereinafter, the top surface of the substrate SUB may refer to a top surface of each component disposed on the substrate SUB, for example, the top surface of the first insulating layer INS1 or the top surface of the passivation layer PSV as well as the top surface of the substrate SUB.

Referring to FIGS. 5 and 6, the second and third insulating layers INS2 and INS3 and the pixel defining layer PDL may be sequentially stacked over the substrate SUB. The second and third insulating layers INS2 and INS3 and the pixel defining layer PDL may be organic insulating layers including an organic material. According to an exemplary embodiment of the present invention, the organic insulating layer may include the second insulating layer INS2 and the third insulating layer INS3. However, the organic insulating layer may also include a single integral organic insulating layer.

Each of the second and third insulating layers INS2 and INS3 may be partially removed to have an opening in the non-display area NDA. The pixel defining layer PDL may have an opening formed by partially removing the area where the openings of the second and third insulating layers INS2 and INS3 are formed. The openings of the second and third insulating layers INS2 and INS3 and the opening of the pixel defining layer PDL may form the first valley VL1.

A portion of the top surface of the substrate SUB may be externally exposed by the first valley VL1. The first valley VL1 may be defined by openings formed in sequentially stacked insulating layers. The openings formed in the insulating layers may have sidewalls which are perpendicular or inclined with respect to the surface of the substrate SUB. Therefore, the width of the first valley VL1 may increase towards the top thereof. Hereinafter, for convenience of description, a "width" of an opening in a predetermined insulating layer may refer to the shortest distance at a portion where the predetermined insulating layer and a component disposed right beneath the insulating layer meet.

According to an exemplary embodiment of the present invention, the first valley VL1 may have different widths varying depending on the second and third insulating layers INS2 and INS3 and the pixel defining layer PDL. In the first valley VL1, the opening formed by the second and third insulating layers INS2 and INS3 may have a first width W1 and the opening formed by the pixel defining layer PDL may have a second width W2. In an exemplary embodiment of the present invention, the second insulating layer INS2 and the third insulating layer INS3 are two different layers. However, the second insulating layer INS2 and the third insulating layer INS3 may be formed as a single layer where desired. According to an exemplary embodiment of the present invention, the opening formed in the second insulating layer INS2 and the third insulating layer INS3 may have sidewalls connected without a step therebetween.

According to an exemplary embodiment of the present invention, the second width W2 may be greater than the first width W1. For example, the pixel defining layer PDL may have a greater width than the third insulating layer INS3. Therefore, the top surface of the third insulating layer INS3 may be partially exposed. The first width W1 may be so large that a residual layer of the pixel defining layer PDL might not be formed during the patterning process of the pixel defining layer PDL.

The first valley VL1 may be formed by forming and patterning the second insulating layer INS2 on the substrate SUB, forming and patterning the third insulating layer INS3 on the second insulating layer INS2, and forming and patterning the pixel defining layer PDL on the third insulating layer INS3. The second insulating layer INS2 and the third insulating layer INS3 may be sequentially formed and simultaneously patterned. Alternatively, after the second insulating layer INS2 and the third insulating layer INS3 are formed as a single insulating layer, the single insulating layer may be patterned.

However, when the first width W1 of the opening of the second and third insulating layers INS2 and INS3 is small during the patterning process of the pixel defining layer PDL, a residual layer of the pixel defining layer PDL may be formed in the opening of the second and third insulating layers INS2 and INS3. The residual layer may serve as a passage through which external oxygen or moisture moves to cause a defective pixel in the display area. However, according to an exemplary embodiment of the present invention, the first width W1 may be sufficiently large so as not to form the residual layer.

Figure 7:
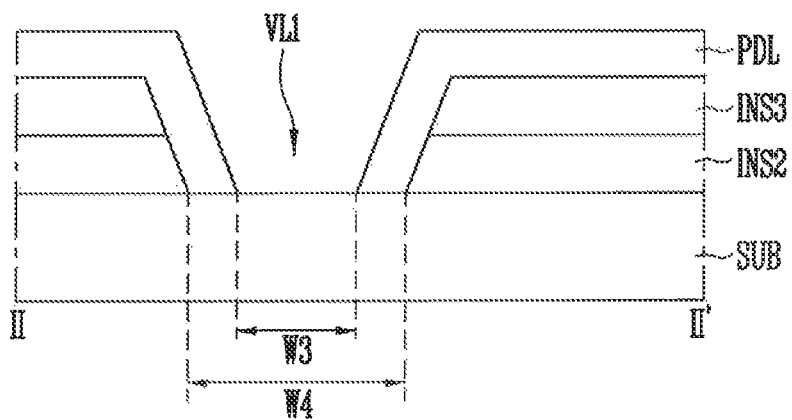
FIG. 7 is a cross-sectional diagram taken along line II-II' of FIG. 5 in a display device according to an exemplary embodiment of the present invention.

FIG. 7 is a cross-sectional view taken along line II-II' of FIG. 5 in a display device according to an exemplary embodiment of the present invention.

Referring to FIGS. 5 and 7, according to an exemplary embodiment of the present invention, the second and third insulating layers INS2 and INS3 and the pixel defining layer PDL may be sequentially stacked on the substrate SUB. The first valley VL1 may have different widths varying depending on the second and third insulating layers INS2 and INS3 and the pixel defining layer PDL. According to an exemplary embodiment of the present invention, the pixel defining layer PDL may be stacked over the second and third insulating layers INS2 and INS3 and cover side surfaces facing the openings of the second and third insulating layers INS2 and INS3. Therefore, in the first valley VL1, when the opening defined by the second and third insulating layers INS2 and INS3 has a fourth width W4 and the opening of the pixel defining layer PDL has a third width W3, the third width W3 may be smaller than the fourth width W4. In addition, the top surface of the third insulating layer INS3 might not be exposed, unlike the exemplary embodiment of the present invention described above with reference to FIG. 6.

According to an exemplary embodiment of the present invention, the width of the opening of the pixel defining layer PDL, e.g., the third width W3, may be less than or equal to the first width W1 of the second and third insulating layers INS2 and INS3 (e.g., organic insulating layers) in the exemplary embodiment of the present invention shown in FIG. 6. The third width W3 of the opening by the pixel defining layer PDL may be greater than the first width W1 of the opening of the second and third insulating layers INS2 and INS3 according to the exemplary embodiment of the present invention shown in FIG. 6, so that the generation of a residual layer during the patterning process of the pixel defining layer PDL may be prevented. In the exemplary embodiment of the present invention shown in FIG. 6, when the pixel defining layer PDL is patterned, the top surfaces of the second and third insulating layers INS2 and INS3 may be exposed to the outside and a portion of the pixel defining layer PDL may remain on the side surfaces of the opening of the second and third insulating layers INS2 and INS3. However, in the exemplary embodiment of the present invention shown in FIG. 7, while the pixel defining layer PDL on the top and side surfaces of the second and third insulating layers INS2 and INS3 may be maintained, a portion of the pixel defining layer PDL may be removed. As a result, the generation of a residual layer of the pixel defining layer PDL may be prevented as much as possible.

Figure 8:
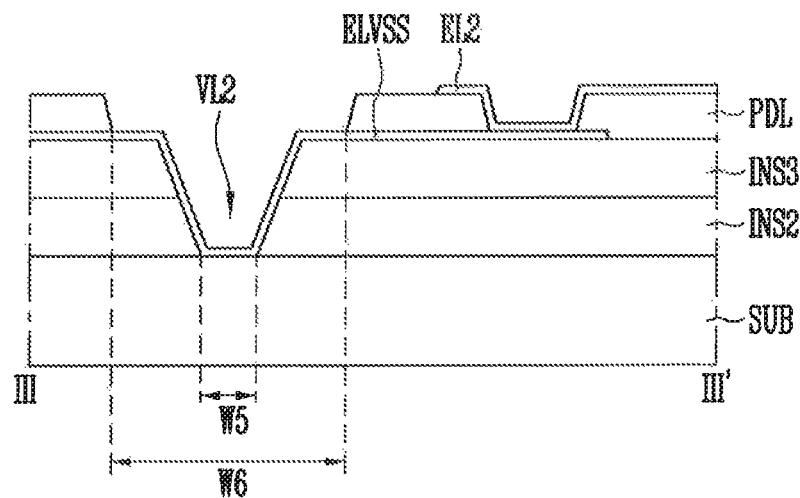
FIG. 8 is a cross-sectional diagram taken along line III-III' of FIG. 5 in a display device according to an exemplary embodiment of the present invention.

FIG. 8 is a cross-sectional view taken along line III-III' of FIG. 5 in a display device according to an exemplary embodiment of the present invention.

Referring to FIGS. 5 and 8, the second and third insulating layers INS2 and INS3, which are organic insulating layers, may be sequentially stacked over the substrate SUB. The second and third insulating layers INS2 and INS3 may be partially removed to have openings in the non-display area NDA.

The second power supply line ELVSS may be disposed over the second and third insulating layer INS3. The second power supply line ELVSS may partially cover the top surfaces of the second and third insulating layers INS2 and INS3 and the opening thereof.

The second power supply line ELVSS may be formed of the same material as the first electrode EL1 by the same process thereof. The second power supply line ELVSS may include a metal layer of Ag, Mg, Al, Pt, Pd, Au, Ni, Nd, Ir, Cr, and/or an alloy thereof, and/or an inorganic material such as indium tin oxide (ITO), indium zinc oxide (IZO), zinc oxide (ZnO), and/or indium tin zinc oxide (ITZO). According to an exemplary embodiment of the present invention, the second power supply line ELVSS may include one type of metal. However, the invention is not limited thereto. For example, the second power supply line ELVSS may include at least two types of metals, for example, an alloy of Ag and Mg.

The pixel defining layer PDL may be stacked on the second power supply line ELVSS. The pixel defining layer PDL may be partially removed to have an opening in the area where the openings of the second and third insulating layers INS2 and INS3. The openings of the second and third insulating layers INS2 and INS3 and the opening of the pixel defining layer PDL may form the second valley VL2.

Portions of the top and side surfaces of the opening of the second and third insulating layers INS2 and INS3 may be covered by the second power supply line ELVSS. As described above, the second power supply line ELVSS may include an inorganic material and may prevent intrusion of oxygen or moisture into the second and third insulating layers INS2 and INS3.

The second electrode EL2 may be stacked on the pixel defining layer PDL. The second electrode EL2 may extend from the display area DA to the non-display area NDA and an end portion thereof may overlap with the second power supply line ELVSS. The pixel defining layer PDL may have a contact hole formed in an overlapping area between the second electrode EL2 and the second power supply line ELVSS. The contact hole may be formed by partially removing the pixel defining layer PDL to expose the top surface of the second power supply line ELVSS. The second electrode EL2 may be connected to the second power supply line ELVSS through the contact hole.

According to an exemplary embodiment of the present invention, the second electrode EL2 may partially cover the pixel defining layer PDL in the non-display area NDA and might not be disposed in the second valley VL2. However, according to an exemplary embodiment of the present invention, the second electrode EL2 may be formed in a different manner. For example, the second electrode EL2 may extend from the pixel area to the second valley VL2 to cover the top surface of the second power supply line ELVSS located in the second valley VL2.

According to an exemplary embodiment of the present invention, the first valley VL1 may have different widths varying depending on the second and third insulating layers INS2 and INS3 and the pixel defining layer PDL. In the second valley VL2, the opening of the second and third insulating layers INS2 and INS3 may have a fifth width W5, the opening of the pixel defining layer PDL may have a sixth width W6, and the sixth width W6 may be greater than the fifth width W5. The fifth width W5 may be so large that a residual layer of the pixel defining layer PDL might not be formed during the patterning process of the pixel defining layer PDL.

According to an exemplary embodiment of the present invention, the fifth width W5 of the opening of the second and third insulating layers INS2 and INS3 may be smaller than the first width W1 of the opening of the second and third insulating layers INS2 and INS3 in the exemplary embodiment of the present invention shown in FIG. 6. In addition, the fifth width W5 of the opening of the second and third insulating layers INS2 and INS3 may be smaller than the third width W3 of the opening of the pixel defining layer PDL in the exemplary embodiment of the present invention shown in FIG. 7.

According to an exemplary embodiment of the present invention, the width of the opening of the second and third insulating layers INS2 and INS3, e.g., the fifth width W5 may be so large that a residual layer of the pixel defining layer PDL might not be formed during the patterning process of the pixel defining layer PDL. In addition, even when a residual layer of the pixel defining layer PDL is formed during the patterning process thereof, intrusion of oxygen or moisture may be reduced due to the shielding effect of the second power supply line ELVSS.

FIGS. 9A to 9D are cross-sectional views taken along line III-III' in a display device according to an exemplary embodiment of the present invention.

Figure 9A:
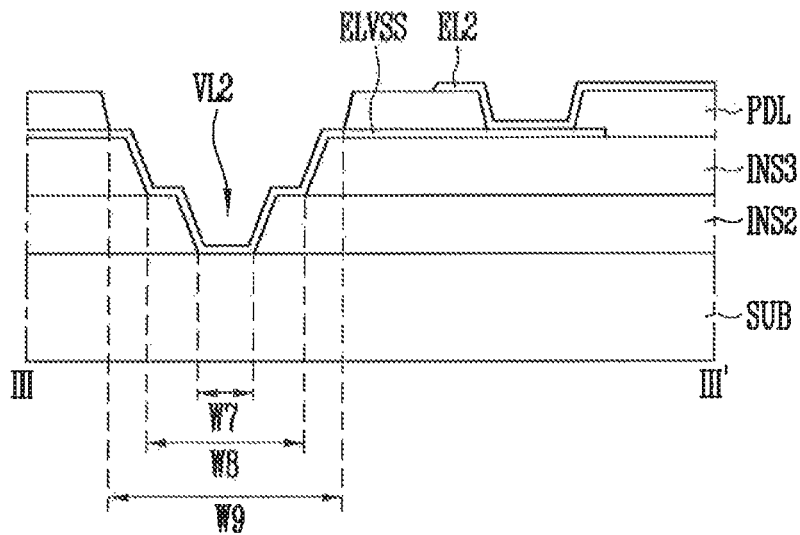
FIGS. 9A to 9D are cross-sectional views taken along line III-III' of FIG. 5 in a display device according to an exemplary embodiment of the present invention.

Referring to FIGS. 5 and 9A, the passivation layer PSV as shown in FIG. 4 may be disposed on the substrate SUB. The second and third insulating layers INS2 and INS3 may be sequentially stacked over the passivation layer PSV.

The second and third insulating layers INS2 and INS3 may be partially removed to have openings in the non-display area NDA. The opening of the third insulating layer INS3 may be formed at a position corresponding to the opening of the second insulating layer INS2. The openings of the second and third insulating layers INS2 and INS3 may overlap with each other as viewed in the plane. The openings of the second and third insulating layers INS2 and INS3 may have stepped side surfaces. Therefore, the opening of the second insulating layer INS2 may have a different width from the opening of the width of the third insulating layer INS3. When the opening of the second insulating layer INS2 has a seventh width W7 and a stepped portion of the openings of the second and third insulating layers INS2 and INS3 has an eighth width W8, the eighth width W8 may be greater than the seventh width W7. The top surface of the second insulating layer INS2 adjacent to the openings may be partially exposed due to the difference in width of the openings.

The second power supply line ELVSS may be disposed on the second and third insulating layers INS2 and INS3. The second power supply line ELVSS may cover portions of the top surfaces of the second and third insulating layers INS2 and INS3 and the side surfaces thereof adjacent to the openings. As described above, the second power supply line ELVSS may include an inorganic material and may prevent intrusion of oxygen or moisture into the second and third insulating layers INS2 and INS3.

The pixel defining layer PDL may be stacked on the second power supply line ELVSS. The pixel defining layer PDL may be partially removed to have an opening at a position corresponding to the openings of the second and third insulating layers INS2 and INS3. When the opening of the pixel defining layer PDL has a ninth width W9, the ninth width W9 may be greater than the seventh width W7 or the eighth width W8.

The openings of the second and third insulating layers INS2 and INS3 and the opening of the pixel defining layer PDL may form the second valley VL2.

The second electrode EL2 may be stacked on the pixel defining layer PDL. The second electrode EL2 may extend from the display area DA to the non-display area NDA and an end portion thereof may overlap with the second power supply line ELVSS. The pixel defining layer PDL may have a contact hole formed in an overlapping region between the second electrode EL2 and the second power supply line ELVSS. The contact hole may be formed by partially removing the pixel defining layer PDL to expose the top surface of the second power supply line ELVSS. The second electrode EL2 may be coupled to the second power supply line ELVSS through the contact hole.

According to an exemplary embodiment of the present invention, the stepped openings of the second and third insulating layers INS2 and INS3 might alternatively have other shapes.

Figure 9B:
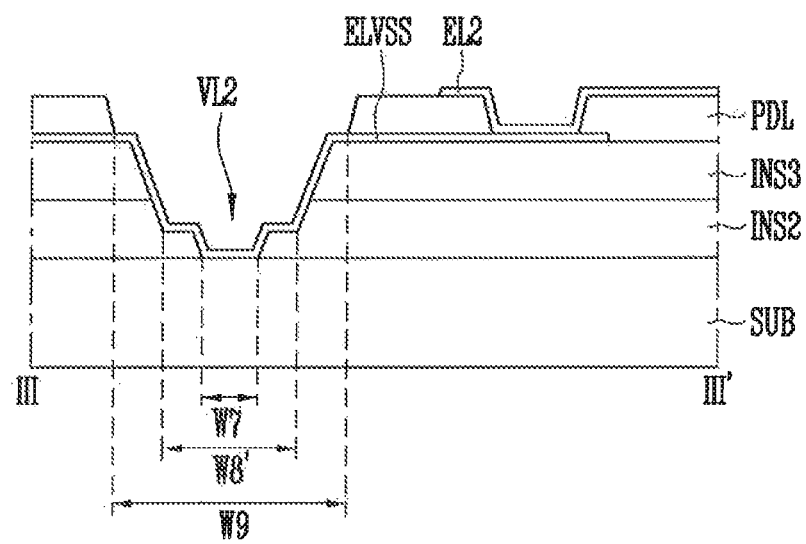

Referring to FIGS. 5 and 9B, the second and third insulating layers INS2 and INS3 may be partially removed to have openings in the non-display area NDA, and the opening of the second insulating layer INS2 may have stepped side surfaces. When the opening of the second insulating layer INS2 has the seventh width W7 and a stepped portion of the opening of the second insulating layer INS2 has an eighth width W8', the eighth width W8' may be greater than the seventh width W7. According to an exemplary embodiment of the present invention, since the stepped portion is disposed on the second insulating layer INS2, the eighth width W8', according to an exemplary embodiment of the present invention, may be smaller than the eighth width W8 according to the exemplary embodiment of the present invention shown in FIG. 9A.

Figure 9C:
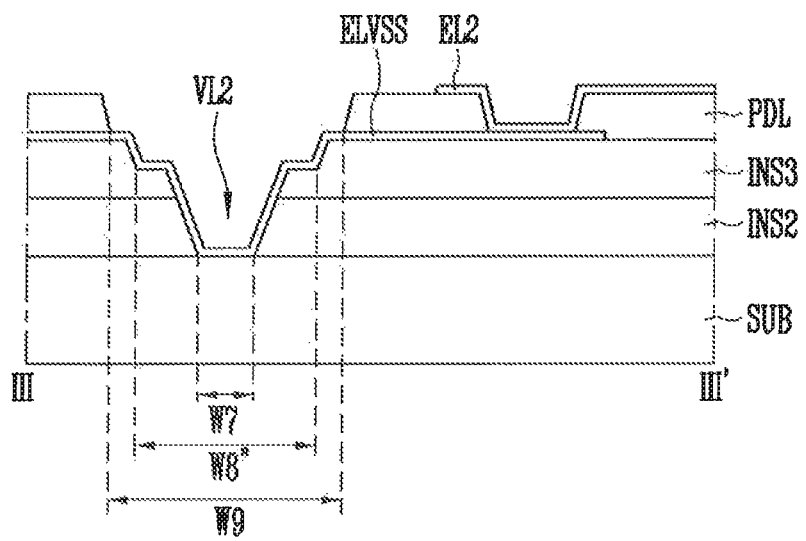

Referring to FIGS. 5 and 9C, the second and third insulating layers INS2 and INS3 may be partially removed to have openings in the non-display area NDA, and the opening of the third insulating layer INS3 may have stepped side surfaces. When the opening of the second insulating layer INS2 has the seventh width W7 and a stepped portion of the opening of the third insulating layer INS3 has an eighth width W8", the eighth width W8" may be greater than the seventh width W7.

According to an exemplary embodiment of the present invention, since the stepped portion is disposed on the third insulating layer INS3, the eighth width W8", according to an exemplary embodiment of the present invention, may be greater than the eighth width W8 according to the exemplary embodiment of the present invention shown in FIG. 9A.

Figure 9D:
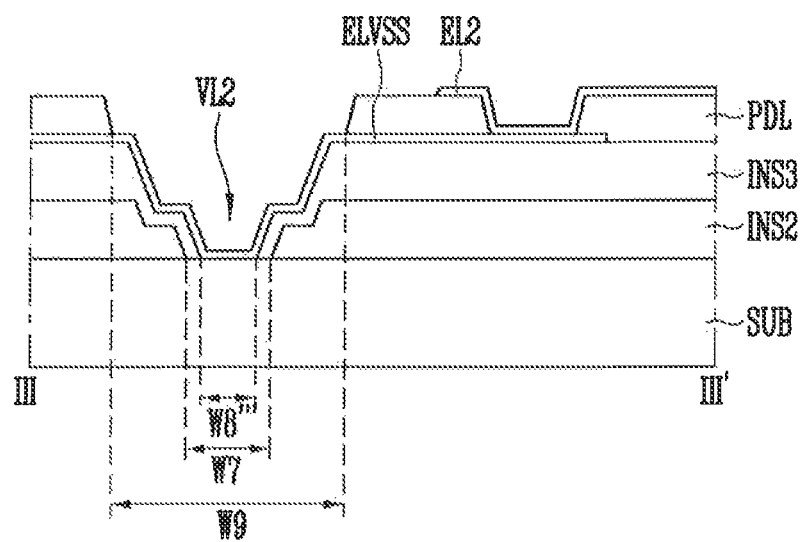

Referring to FIGS. 5 and 9D, the second and third insulating layers INS2 and INS3 may be partially removed to have openings in the non-display area NDA, the second insulating layer INS2 may have stepped side surfaces, and the third insulating layer INS3 may cover the entire stepped side surfaces of the second insulating layer INS2.

According to an exemplary embodiment of the present invention, FIG. 9C illustrates that the second insulating layer INS2 and the third insulating layer INS3 have similar thicknesses. However, the second insulating layer INS2 may have a greater thickness than the third insulating layer INS3. When the second insulating layer INS2 has a relative large thickness, the third insulating layer INS3 may have a smaller thickness than the second insulating layer INS2, so that the third insulating layer INS3 may easily cover top and side surfaces of the second insulating layer INS2.

When the opening of the second insulating layer INS2 has the seventh width W7 and the opening defined by the third insulating layer INS3 has an eighth width W8''', the eighth width W8''', according to an exemplary embodiment of the present invention, may be smaller than the seventh width W7.

Like the above-described exemplary embodiments of the present invention, the second valley VL2 may have different widths varying depending on the second and third insulating layers INS2 and INS3 and the pixel defining layer PDL. In the second valley VL2, the openings of the second and third insulating layers INS2 and INS3 may have stepped portions therein. Since the stepped portions are disposed inside the side surfaces of the second valley VL2, an average slope formed between the side surface and the bottom surface may become relatively small. Therefore, a residual layer of the pixel defining layer PDL may be less likely to form during the patterning process of the pixel defining layer PDL.

The openings of the above-described second and third insulating layers INS2 and INS3 may be made to be stepped by a photolithography process. The stepped portion between the second and third insulating layers INS2 and INS3 may be formed by performing photolithography on the second and third insulating layers INS2 and INS3 by using a mask. The stepped portion of the second insulating layer INS2 or the stepped portion of the third insulating layer INS3 may be formed using two masks or a single mask such as a half-tone mask or a slit mask.

The seventh width W7 may be so large that a residual layer of the pixel defining layer PDL might not remain during the patterning process of the pixel defining layer PDL. The seventh width W7 may be smaller than the first width W1, the fourth width W4, and the fifth width W5. Since the second insulating layer INS2 and the third insulating layer INS3 have openings with different widths, it may be easier to pattern the pixel defining layer PDL. In addition, although the residual layer of the pixel defining layer PDL is formed during the patterning process thereof, intrusion of oxygen or moisture may be reduced by the shielding effect of the second power supply line ELVSS. According to the above-described exemplary embodiments of the present invention, the shape of the valley VL may vary depending on whether or not the second power supply line ELVSS (or other lines disposed on the same layer as the second power supply line ELVSS) is present. For example, although the exemplary embodiments shown in FIGS. 6 and 7 are related to the first valley VL1, when there is a portion where the second power supply line ELVSS is not present, these exemplary embodiments of the present invention may also be applied to the second to fourth valleys VL2 to VL4. In addition, although the exemplary embodiments of the present invention shown in FIGS. 8 and 9 are related to the second valley VL2 corresponding to the second side S2, these exemplary embodiments of the present invention may also be applied to the third and fourth valleys VL3 and VL4, and to the first valley VL1 depending on the situation.

In the above-described exemplary embodiments of the present invention, it is illustrated that one valley corresponds to each side of the substrate. However, the invention is not limited thereto. One or more valleys may surround the display area along the edge of the display area and have various shapes depending on each area.

Figure 10C:
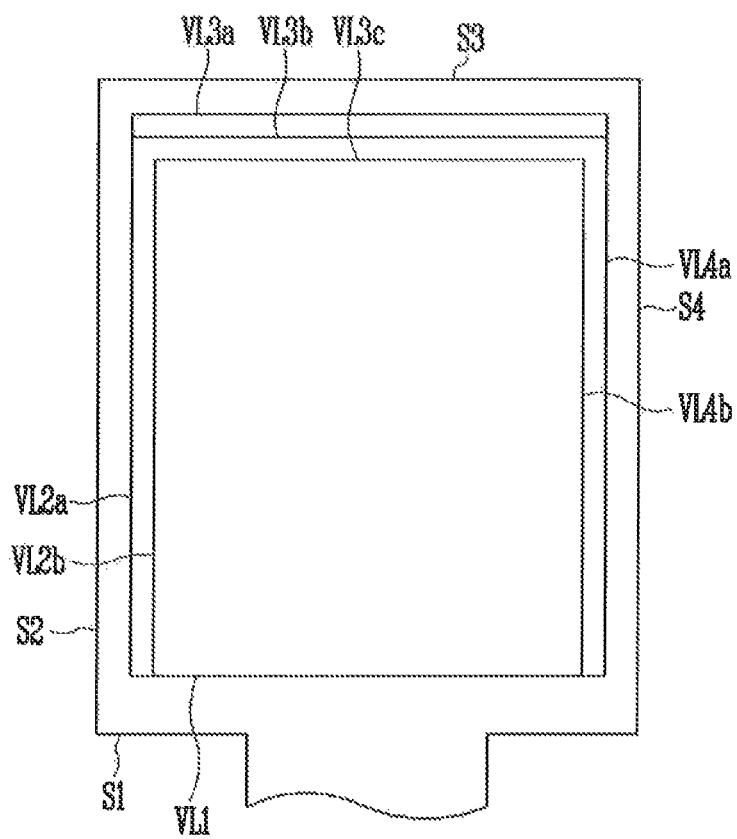

FIGS. 10A to 10C are plan views illustrating valleys formed by various methods in a display device according to an exemplary embodiment of the present invention.

Referring to FIG. 10A, the first, second, third and fourth valleys VL1, VL2, VL3, and VL4 may correspond to the first second, third and fourth sides S1, S2, S3, and S4 of the substrate, respectively. According to an exemplary embodiment of the present invention, each of the first valley VL1, the second valley VL2, and the fourth valley VIA may be disposed as a single body, whereas the third valley VL3 may be disposed as two valleys VL3a and VL3b.

Referring to FIG. 10B, when the first, second, third and fourth valleys VL1, VL2, VL3, and VL4 corresponding to the first, second, third and fourth sides S1, S2, S3 and S4 of the substrate, respectively, are disposed, according to an exemplary embodiment of the present invention, each of the first, second, third and fourth valleys VL1, VL2, VL3, and VL4 may be disposed as a pair of valleys (VL1a and VL1b, VL2a and VL2b, VL3a and VL3b, and VL4a and VL4b).

Referring to FIG. 10C, when the first, second, third and fourth valleys VL1, VL2, VL3, and VL4 correspond to the first, second, third and fourth sides S1, S2, S3 and S4 of the substrate, respectively, according to an exemplary embodiment of the present invention, the first valley VL1 may be disposed as one valley, the second valley VL2 may be disposed as two valleys VL2a and VL2b, the third valley VL3 may be disposed as three valleys VL3a, VL3b, and VL3c, and the fourth valley VL4 may be disposed as two valleys VL4a and VL4b.

In the above-described exemplary embodiments of the present invention, a display device may have a valley formed by partially removing an organic layer along the circumference of a display area, and the valley may be disposed into various shapes. In addition, generation of a residual layer may be reduced by setting the valley to various widths when forming a pixel defining layer. Accordingly, the display device, according to an exemplary embodiment of the present invention, may effectively prevent external intrusion of oxygen or moisture into a display area.

A display device, according to an exemplary embodiment of the present invention, may be used in various types of electronic devices. For example, the display device may be applicable to televisions, notebooks, smartphones, smartpads, portable media players (PMPs), person digital assistances (PDAs), navigations, or various types of wearable devices, such as smartwatches.

Figure 11:
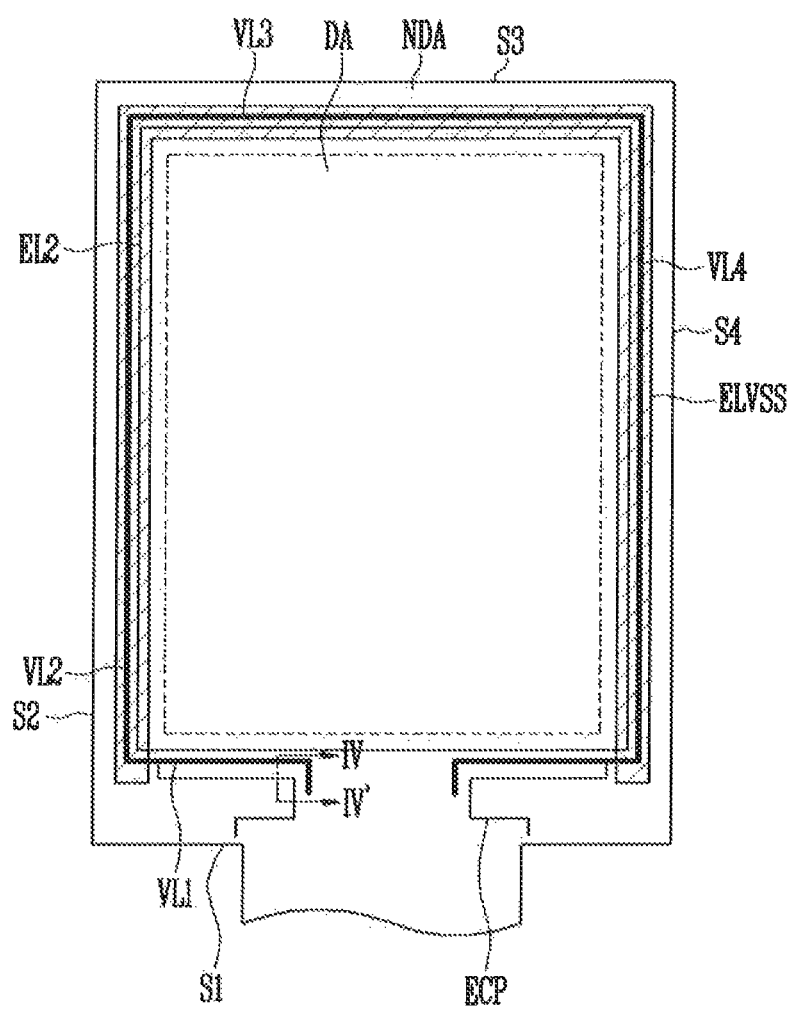
FIG. 11 is a plan view illustrating some of the components a valley and a clad in a non-display area of a display device according to an exemplary embodiment of the present invention.
Figure 12A:
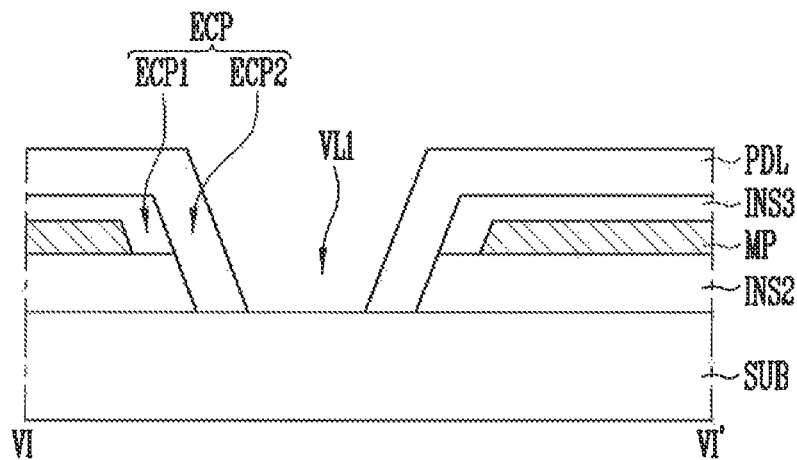
FIGS. 12A and 12B are cross-sectional views taken along IV-IV' of FIG. 11 in a display device according to an embodiment of the present invention.
Figure 12B:
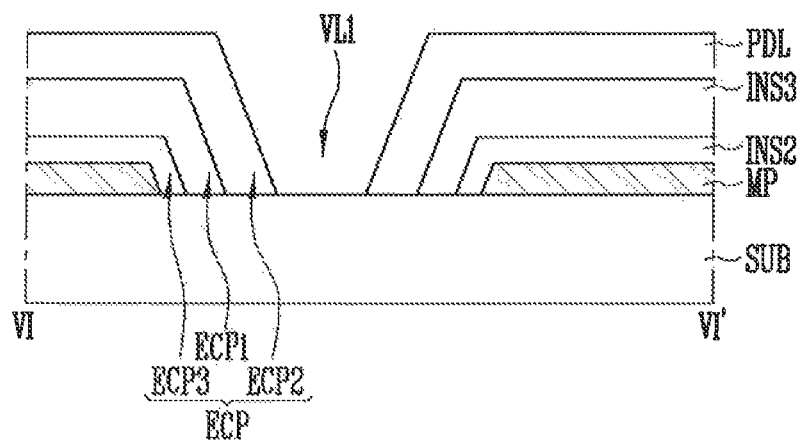

FIG. 11 is a plan view illustrating some of the components connected to a valley and an edge clad path in a non-display area of a display device according to an exemplary embodiment of the present invention. FIGS. 12A and 12B are cross-sectional views taken along line IV-IV' of FIG. 11 in a display device according to an exemplary embodiment of the present invention.

FIGS. 12A and 12B, it is to be understood that various additional components may be disposed between the substrate SUB and the second insulating layer INS2. Examples of the components, not illustrated, disposed between the substrate SUB and the second insulating layer INS2 may include insulating layers, such as a buffer layer, a gate insulating layer, an interlayer insulating layer, a first insulating layer, a passivation layer and a sealing layer, and lines disposed on the respective insulating layers (other line parts including gate lines and data lines). Hereinafter, the top surface of the substrate SUB may refer to top surfaces of the respective components disposed on the substrate SUB, such as the top surface of the first insulating layer INS1 or the top surface of the passivation layer PSV, as well as the top surface of the substrate SUB.

Referring to FIGS. 11, 12A and 12B, the substrate SUB, according to an exemplary embodiment of the present invention, may have a rectangular shape. The substrate SUB may include four sides which are sequentially connected from one short side, e.g., the first to fourth sides S1 to S4.

The substrate SUB may include the display area DA and the non-display area NDA disposed on at least one side of the display area DA. According to an exemplary embodiment of the present invention, the display area DA may have a rectangular shape, and the non-display area NDA may have a square ring shape surrounding the display area DA.

A line part may be disposed in the non-display area NDA. As illustrated in FIG. 2, the data lines may be disposed in the non-display area NDA corresponding to the first side S1. The second power supply line ELVSS may be disposed along the edge of the display area DA in the non-display area NDA corresponding to the second, third, and fourth sides S2, S3, and S4. The second power supply line ELVSS may be disposed to have a predetermined width in the non-display area NDA corresponding to the second, third, and fourth sides S2, S3, and S4. The second power supply line ELVSS may be connected to the driver through some of the lines disposed in the non-display area NDA corresponding to the first side S1.

The valley VL may be disposed in the non-display area NDA by partially removing the organic insulating layer along the circumference of the display area DA. The valley VL may surround the display area DA.

The valley VL may include the first, second, third and fourth valleys VL1, VL2, VL3, and VL4 corresponding to the first, second, third and fourth sides S1, S2, S3, and S4 of the substrate SUB, respectively. The first, second, third and fourth valleys VL1, VL2, VL3, and VL4 may extend from the non-display area NDA in extending directions of the first, second, third and fourth sides S1, S2, S3 and S4 of the substrate SUB, respectively. According to an exemplary embodiment of the present invention, the planar shape of the first valley VL1 as shown in FIG. 11 may have a partially opened shape.

As illustrated in FIG. 11, the first, second, third and fourth valleys VL1, VL2, VL3, and VLA may be straight lines. However, as illustrated in FIGS. 12A and 12B, the actual shapes of the first, second, third and fourth valleys VL1, VL2, VL3, and VL4 may be openings having predetermined widths. As viewed in the plane, the first, second, third and fourth valleys VL1, VL2, VL3, and VL4 might not necessarily extend in a straight direction. According to an exemplary embodiment of the present invention, the shapes of the first, second, third and fourth valleys VL1, VL2, VL3, and VL4 may vary depending on the arrangement of the lines at regions where the first, second, third and fourth valleys VL1, VL2, VL3, and VLA are disposed. For example, at least some of the first, second, third and fourth valleys VL1, VL2, VL3, and VL4 may be bent at least once or curved as viewed in the plane.

An edge clad path ECP may be disposed in the non-display area NDA. One end of the edge clad path ECP may be connected to the first valley VL1 and at least a portion of the edge clad path ECP may be parallel with the first valley VL1. In addition, the edge clad path ECP may be curved or bent at least once.

The valley VL and the edge clad path ECP are described below with reference to FIGS. 12A and 12B.

Referring to FIGS. 12A and 12B, the second and third insulating layers INS2 and INS3 and the pixel defining layer PDL may be sequentially stacked over the substrate SUB. The second and third insulating layers INS2 and INS3 and the pixel defining layer PDL may be organic insulating layers formed of an organic material. According to an exemplary embodiment of the present invention, it is illustrated that the organic insulating layer is divided into the second insulating layer INS2 and the third insulating layer INS3. However, a singular organic insulating layer may also be included in addition to the organic insulating layer divided into the second insulating layer INS2 and the third insulating layer INS3.

The second insulating layer INS2, the third insulating layer INS3 and the pixel defining layer PDL may be partially removed to have openings. The openings of the second insulating layer INS2, the third insulating layer INS3 and the pixel defining layer PDL may form the valley VL.

A conductive pattern MP may be disposed on the substrate SUB or the second insulating layer INS2. The conductive pattern MP may be the first power supply line ELVDD for supplying a first power to each pixel. The conductive pattern MP may generally include a conductive metal. Residue may be present in an area adjacent to the edge of the conductive pattern MP. The residue of the conductive pattern MP may generate a short circuit with another conductive layer.

As illustrated in FIG. 12A, when the conductive pattern MP is disposed on the second insulating layer INS2, the edge of the conductive pattern MP adjacent to the valley VL may be covered by the third insulating layer INS3 and the pixel defining layer PDL.

Areas of the third insulating layer INS3 and the pixel defining layer PDL that cover the conductive pattern MP may be the edge clad path ECP. The edge clad path ECP may include a first edge clad path ECP1 corresponding to the area where the third insulating layer INS3 covers the conductive pattern MP and a second edge clad path ECP2 corresponding to the area where the pixel defining layer PDL covers the conductive pattern MP. In other words, the third insulating layer INS3 and the pixel defining layer PDL may include the first edge clad path ECP1 and the second edge clad path ECP2.

As illustrated in FIG. 12B, when the conductive pattern MP is located on the substrate SUB, the edge of the conductive pattern MP adjacent to the valley VL may be covered by the second insulating layer INS2, the third insulating layer INS3 and the pixel defining layer PDL.

Areas of the second insulating layer INS2, the third insulating layer INS3 and the pixel defining layer PDL that cover the conductive pattern MP may be the edge clad path ECP. The edge clad path ECP may include the first edge clad path ECP1 corresponding to the area where the third insulating layer INS3 covers the conductive pattern MP, the second edge clad path ECP2 corresponding to the area where the pixel defining layer PDL covers the conductive pattern MP, and a third edge clad path ECP3 corresponding to the area where the second insulating layer INS2 covers the conductive pattern MP. In other words, the second insulating layer INS2, the third insulating layer INS3 and the pixel defining layer PDL may include the first edge clad path ECP1, the second edge clad path ECP2 and the third edge clad path ECP3.

Even when residuals of the conductive pattern MP are present in an area adjacent to the edge of the conductive pattern MP, the residuals may be covered by the second insulating layer INS2, the third insulating layer INS3 and the pixel defining layer PDL. Therefore, the residuals of the conductive pattern MP may be prevented from being short-circuited with another conductive layer.

The edge clad path ECP may refer to an area where the organic insulating layer covers the conductive pattern MP, and the organic insulating layer may serve as a passage for the oxygen or moisture. Therefore, as illustrated in FIG. 11, when the edge clad path ECP is bent, the passage for oxygen or moisture may be extended, so that intrusion of oxygen or moisture into the pixel may be delayed.

According to an exemplary embodiment of the present invention, a display device may reduce the generation of a residual layer during a patterning process of a pixel defining layer and effectively prevent intrusion of oxygen or moisture into a pixel.

While the present invention has been shown and described with reference to exemplary embodiments thereof, it will be apparent to those of ordinary skill in the art that various changes in form and detail may be made therein without departing from the spirit and scope of the present invention.

What is claimed is:
1. A display device, comprising:
a substrate including a display area configured to display an image and a non-display area disposed on at least one side of the display area;
a plurality of pixels disposed in the display area;
an organic insulating layer disposed on the substrate, a pixel defining layer disposed on the organic insulating layer; and
a sealing layer and including an inorganic material,
wherein the organic insulating layer and the pixel defining layer have a valley disposed therein, the valley being an opening through the organic insulating layer and the pixel defining layer along a circumference of the display area, and
wherein the sealing layer covers the display area and the valley and terminates at a boundary between the organic insulating layer of the non-display area and the valley.

2. The display device of claim 1, wherein the organic insulating layer includes an opening having a first width, the pixel defining layer includes an opening having a second width, and the opening of the organic insulating layer and the opening of the pixel defining layer form the valley.

3. The display device of claim 2, wherein the first width and the second width are different from each other.

4. The display device of claim 2, wherein the sealing layer covers side surfaces of the organic insulating layer and the pixel defining layer.

5. The display device of claim 2, wherein the valley has a closed shape surrounding the display area.

6. The display device of claim 2, wherein the substrate has a quadrangular shape including first to fourth sides, and the valley includes first to fourth valleys corresponding to the first to fourth sides of the quadrangular shape, respectively.

7. The display device of claim 6, wherein at least one of the first to fourth valleys includes a plurality of valleys.

8. The display device of claim 2, wherein each of the plurality of pixels comprises:
a first electrode disposed on the organic insulating layer;
an emission layer disposed on the first electrode; and
a second electrode disposed on the emission layer and the pixel defining layer.

9. The display device of claim 8, further comprising a power supply line disposed in the non-display area and supplying power to the second electrode.

10. The display device of claim 8, further comprising a power supply line disposed in the non-display area and supplying power to the second electrode,
wherein the substrate has a quadrangular shape including first to fourth sides, and the valley includes first to fourth valleys corresponding to the first to fourth sides of the quadrangular shape, respectively,
wherein the power supply line is disposed to correspond to at least one of the first to fourth sides of the quadrangular shape in the non-display area.

11. The display device of claim 10, wherein the power supply line is disposed to correspond to the second to fourth sides of the quadrangular shape, and the first width of the first valley is different from the first width of one of the second to fourth valleys.

12. The display device of claim 11, wherein the first width of the first valley is greater than the first width of one of the second to fourth valleys.

13. The display device of claim 11, wherein in an area corresponding to the first valley, the pixel defining layer covers a side surface of the organic insulating layer.

14. The display device of claim 13, wherein in the area corresponding to the first valley, the second width is less than or equal to the first width.

15. The display device of claim 11, wherein the power supply line is disposed between the organic insulating layer and the pixel defining layer.

16. The display device of claim 15, wherein the organic insulating layer includes:
  a first organic insulating layer including an opening having a third width; and
  a second organic insulating layer including an opening having a fourth width greater than the third width.

17. The display device of claim 2, wherein the pixel defining layer includes an organic material.

18. The display device of claim 2, wherein the sealing layer includes a first inorganic insulating layer, an organic insulating layer, and a second inorganic insulating layer sequentially stacked on each other.

19. The display device of claim 1, further comprising a passivation layer disposed between the substrate and the organic insulating layer.

20. The display device of claim 19, wherein the passivation layer includes an inorganic material.

21. A display device, comprising:
  a substrate including a display configured to display an image and a non-display area disposed on at least one side of the display area;
  a plurality of pixels disposed in the display area;
  an organic insulating layer disposed on the substrate, a pixel defining layer disposed on the organic insulating layer;
  a sealing layer at least partially covering the display area and the non-display area and including an inorganic material; and
  a conductive pattern disposed on the substrate,
  wherein the organic insulating layer and the pixel defining layer have a valley disposed therein, the valley being formed by removing portions of the organic insulating layer and the pixel defining layer along a circumference of the display area,
  wherein the organic insulating layer includes an opening having a first width, the pixel defining layer includes an opening having a second width, and the opening of the organic insulating layer and the opening of the pixel defining layer form the valley, and
  wherein the organic insulating layer and the pixel defining layer include an edge clad path covering an edge of the conductive pattern.

22. The display device of claim 21, wherein the edge clad path is connected to the valley.

23. The display device of claim 22, wherein the edge clad path is bent or curved at least once.

24. A display device, comprising:
  a substrate including a display configured to display an image and a non-display area disposed on at least one side of the display area;
  a plurality of pixels disposed in the display area;
  an organic insulating layer disposed on the substrate, a pixel defining layer disposed on the organic insulating layer;
  a sealing layer at least partially covering the display area and the non-display area and including an inorganic material; and
  a conductive pattern disposed on the organic insulating layer,
  wherein the organic insulating layer and the pixel defining layer have a valley disposed therein, the valley being formed by removing portions of the organic insulating layer and the pixel defining layer along a circumference of the display area,
  wherein the organic insulating layer includes an opening having a first width, the pixel defining layer includes an opening having a second width, and the opening of the organic insulating layer and the opening of the pixel defining layer form the valley, and
  wherein the pixel defining layer comprises an edge clad path covering an edge of the conductive pattern.

25. The display device of claim 24, wherein the edge clad path is connected to the valley.

26. The display device of claim 25, wherein the edge clad path is bent or curved at least once.

* * * * *